US011218073B2

(12) United States Patent
Huang

(10) Patent No.: US 11,218,073 B2
(45) Date of Patent: Jan. 4, 2022

(54) DIFFERENTIAL MODE ELECTROMAGNETIC NOISE INJECTION NETWORK AND ACTIVE ELECTROMAGNETIC INTERFERENCE FILTER

(71) Applicant: MINYE INFORMATION TECH. (SHANGHAI) CO., LTD., Shanghai (CN)

(72) Inventor: Minchao Huang, Shanghai (CN)

(73) Assignee: MINYE INFORMATION TECH. (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 17/056,422

(22) PCT Filed: May 27, 2019

(86) PCT No.: PCT/CN2019/088498
§ 371 (c)(1),
(2) Date: Nov. 18, 2020

(87) PCT Pub. No.: WO2019/223802
PCT Pub. Date: Nov. 28, 2019

(65) Prior Publication Data
US 2021/0218327 A1    Jul. 15, 2021

(30) Foreign Application Priority Data

May 25, 2018  (CN) .......................... 201810512206.0

(51) Int. Cl.
*H02M 1/44*    (2007.01)
*H01F 27/28*   (2006.01)
*H01F 27/34*   (2006.01)
(Continued)

(52) U.S. Cl.
CPC .......... *H02M 1/44* (2013.01); *H01F 27/2823* (2013.01); *H01F 27/34* (2013.01); *H02M 1/126* (2013.01); *H03H 7/427* (2013.01)

(58) Field of Classification Search
CPC ........ H02M 1/44; H02M 1/126; H02M 3/335; H02M 3/33573; H02M 1/0009;
(Continued)

(56) References Cited

U.S. PATENT DOCUMENTS

2002/0167822 A1* 11/2002 Odell ...................... H01F 38/42
                                                        363/21.12
2006/0038611 A1*  2/2006 Regier ............... H03H 11/1217
                                                        327/552

(Continued)

FOREIGN PATENT DOCUMENTS

CN    203933015 U    11/2014
CN    206807285 U    12/2017
(Continued)

*Primary Examiner* — S M Sohel Imtiaz
(74) *Attorney, Agent, or Firm* — Bayramoglu Law Offices LLC

(57) ABSTRACT

A differential mode electromagnetic noise injection network includes an injection piece and a differential mode loop. The injection piece includes a semiconductor transistor or a winding differential mode inductor. The injection piece is at least provided with a first injection end, a second injection end, and a differential mode electromagnetic noise component input end. The differential mode electromagnetic noise component input end is configured to input a differential mode electromagnetic noise component. The first injection end and the second injection end are connected to any two points that are connected in series in the differential mode loop in a one-to-one correspondence, and are configured to inject the differential mode electromagnetic noise component. An active electromagnetic interference filter including (Continued)

the differential mode electromagnetic noise injection network mentioned above is provided.

14 Claims, 18 Drawing Sheets

(51) Int. Cl.
    *H02M 1/12*     (2006.01)
    *H03H 7/42*     (2006.01)

(58) Field of Classification Search
    CPC ... H02M 1/007; H02M 1/123; H01F 27/2823;
            H01F 27/34; H03H 7/427; H03H 11/1217
    See application file for complete search history.

(56) References Cited

U.S. PATENT DOCUMENTS

| | | | |
|---|---|---|---|
| 2008/0265794 A1* | 10/2008 | Foo | H05B 41/282 |
| | | | 315/276 |
| 2009/0295530 A1* | 12/2009 | Faccin | H01F 27/325 |
| | | | 336/220 |
| 2012/0140525 A1* | 6/2012 | Cuadra | H01F 38/14 |
| | | | 363/21.04 |
| 2014/0153290 A1* | 6/2014 | Li | H02M 3/01 |
| | | | 363/17 |
| 2014/0239825 A1* | 8/2014 | Choi | H05B 45/3725 |
| | | | 315/186 |
| 2020/0287460 A1* | 9/2020 | Samizo | H02M 1/0009 |
| 2021/0135583 A1* | 5/2021 | Ohashi | H02M 3/33584 |

FOREIGN PATENT DOCUMENTS

| | | | |
|---|---|---|---|
| CN | 108233355 A | | 6/2018 |
| CN | 207559960 U | | 6/2018 |
| CN | 207652310 U | | 7/2018 |
| CN | 108418569 A | | 8/2018 |
| KR | 20160123034 A | * | 10/2016 |
| KR | 20160123034 A | | 10/2016 |

\* cited by examiner

DIFFERENTIAL MODE ELECTROMAGNETIC NOISE INJECTION NETWORK AND ACTIVE ELECTROMAGNETIC INTERFERENCE FILTER

CROSS REFERENCE TO THE RELATED APPLICATIONS

This application is the national phase entry of International Application No. PCT/CN2019/088498, filed on May 27, 2019, which is based upon and claims priority to Chinese Patent Application No. 201810512206.0, filed on May 25, 2018, the entire contents of which are incorporated herein by reference.

TECHNICAL FIELD

The present invention relates to electronic filtering, and in particular, to a differential mode electromagnetic noise injection network and an active electromagnetic interference filter.

BACKGROUND

FIG. 1 is a schematic diagram of the connection between electrical equipment and a power supply system. As shown in FIG. 1, as the number of electronic apparatus continues to increase, high-frequency electromagnetic noise generated by electrical equipment will not only affect the equipment, but noise also affects the power supply system. As a result, the European Union proposed Electromagnetic Compatibility ("EMC") regulations in 1996 making it mandatory that all electronic equipment using a public power grid must satisfy requirements for limit values of relevant EMC regulations. The power supply system may be an alternating-current (AC) or a direct-current (DC) power supply system.

FIG. 2 is a functional schematic diagram of a passive electromagnetic interference (EMI) filter in the prior art. As shown in FIG. 2, in order to satisfy electromagnetic interference (EMI) requirements in the EMC regulations, almost all the electrical equipment adopts passive EMI filters formed by passive devices. The passive EMI filters are connected in series between the electrical equipment and the power supply system to suppress the electromagnetic noise in the electrical equipment, satisfy requirements for the limit values of the EMI regulations, and avoid affecting the power supply system.

The passive EMI filter is typically formed by a common mode EMI filter and/or a differential mode EMI filter. FIG. 3 is a schematic diagram of a common mode EMI filter in the prior art. As shown in FIG. 3, the common mode EMI filter is formed by the common mode inductor $L_{cm}$ and the capacitor $C_Y$. FIG. 4 is a schematic diagram of a differential mode EMI filter in the prior art. As shown in FIG. 4, the differential mode EMI filter is formed by the differential mode inductor $L_{dm}$ and the capacitor $C_X$.

Although the passive EMI filter can suppress the electromagnetic noise, satisfy the requirements for the limit values of EMI regulations and avoid affecting the surrounding electronic equipment and the power supply grid, its serial connection will cause a lot of problems as follows:

First, serious loss: when suppressing a weak electromagnetic noise in µA level, for example, the passive EMI filter has to withstand a load current of the electrical equipment, thereby causing the additional loss and heat, and reducing the energy efficiency and reliability of the electrical equipment.

Second, large volume: in order to withstand the load current of the electrical equipment, the volumes of the common mode inductor and the differential mode inductor have to be increased to even exceed a volume of functional circuits of the electrical equipment, which puts the incidental before the fundamental.

Third, increased cost: in order to satisfy demands for suppressing electromagnetic noises in different frequency bands, it is usually necessary to adopt common mode inductors with different magnetic materials to suppress the electromagnetic noises in different frequency bands, and this will inevitably lead to a multi-stage filtering architecture, increase the cost and the volume of the passive EMI filters, and also causes more loss and heat at the same time.

Fourth, near-field coupling: due to the large volume of passive devices and the influence of stray parameters, near-field coupling and resonance appear in high frequency bands of the electromagnetic noise, which causes a filtering effect to fail to meet design expectations.

FIGS. 5A-5D are conceptual schematic diagrams showing an active EMI filter in the prior art. As shown in FIGS. 5A-5D, in order to solve the shortcomings of the aforementioned traditional passive EMI filters, a conceptual structure of the active EMI filter is put forward. The active EMI filter collects an electromagnetic noise current or voltage signal generated by post-stage electrical equipment and achieves the closed-loop feedback after gain amplification to suppress the noise.

Some other known active EMI filters extract the common mode electromagnetic noise flowing through the common mode inductor by adding a third coupling winding on a conventional common mode inductor, and after the gain amplification processing, the common mode electromagnetic noise is injected into a common mode loop including a ground or a shell through the capacitor to suppress the common mode noise.

However, since the three windings of the common mode inductor cannot be fully coupled, there will always be about 3% to 5% of inductance leakage, so that the common mode inductor will also be coupled with a portion of the differential mode electromagnetic noise when being coupled with the common mode electromagnetic noise. The differential mode electromagnetic mode is mixed in the common mode electromagnetic noise to be amplified together and injected into the common mode loop, and this finally causes the new common mode electromagnetic noise due to the mixing of the differential mode electromagnetic noise, thereby failing to achieve the expected suppression effect of the common mode electromagnetic noise.

Some known active differential mode EMI filters obtain the differential mode electromagnetic noise by sampling voltage signals of the inductor that is connected in series on a DC bus line, and after the amplification processing, an impedance of a metal-oxide-semiconductor field effect transistor (MOSFET) is controlled to suppress the differential mode noise. However, the DC bus line for power supply may simultaneously contain the differential mode electromagnetic noise and the common mode electromagnetic noise. Thus, the electromagnetic noise obtained from the inductor not only includes the differential mode electromagnetic noise, but also includes the common mode electromagnetic noise. Such differential mode electromagnetic noise mixed with the common mode electromagnetic noise, after the amplification processing, is injected to a differential mode loop by changing the impedance of the MOSFET, which finally causes the new differential mode electromagnetic noise due to the mixing of the common mode electromagnetic noise, thereby failing to achieve the expected suppression effect of the differential mode noise.

FIG. 6 is a setup diagram for a test of the standard conduction emission in the prior art. As shown in FIG. 6, according to a CISP16-1-2 standard test setup diagram for conduction emission, the standard line impedance stabilization network (LISN) is configured to be connected in series between a power grid system and the electrical equipment to extract the conduction emission noise of the tested equipment. During the conduction emission test, the electromagnetic noise detected by a receiver is extracted through the coupling of the LISN. As shown in FIG. 6, the electromagnetic noise current $I_{input1}$ flowing on the input cable 11 includes ½ of common mode electromagnetic noise current $I_{CM}$ in an identical direction and the differential mode electromagnetic noise current $I_{DM}$, while the electromagnetic noise current $I_{input2}$ flowing on another return input cable 12 includes ½ common mode electromagnetic noise current $I_{CM}$ in the identical direction and the differential mode electromagnetic noise current $I_{DM}$ in an opposite direction. The ½ of common mode electromagnetic noise current $I_{CM}$ in the identical direction in the input cables 11 and 12 will pass through the common mode electromagnetic noise source 101 in the tested electrical equipment to return to the receiver via a grounded metal plate during the conduction test, so that the common mode electromagnetic noise current $I_{CM}$ is detected by the receiver. The differential mode electromagnetic currents generated by the differential mode electromagnetic noise source 100 in the tested electrical equipment flow in the input cables 11 and 12 in opposite directions, and are detected by the receiver after being coupled by the LISN.

A schematic diagram of the existing active EMI filter shown in FIGS. 5A-5D adapts to suppressing the common mode electromagnetic noise, and also adapts to suppressing the differential mode electromagnetic noise. However, transfer paths of the common mode electromagnetic noise and the differential mode electromagnetic noise are different. The differential mode electromagnetic noise may be merely transferred through a differential mode loop. The common mode electromagnetic noise may be merely transferred through a common ode path, but will overlap on the input cables and inside the electrical equipment, and the other half transfer path of the common mode electromagnetic noise passes through the ground and is then detected by the receiver used for the electromagnetic interference test. Thus, it is very critical for suppressing the differential mode and common mode electromagnetic noises by fully isolating and extracting the differential mode and common mode electromagnetic noises in the electrical equipment and separately injecting them.

SUMMARY

The present invention provides a differential mode electromagnetic noise injection network. The differential mode electromagnetic noise injection network is capable of enabling a processed differential mode electromagnetic noise to return to a differential mode noise source in electrical equipment through a differential mode loop to minimize the amount of the electromagnetic noise of the electrical equipment entering a power supply system.

An aspect of the present invention provides a differential mode electromagnetic noise injection network, including an injection piece and a differential mode loop. The injection piece is at least provided with a first injection end, a second injection end and a differential mode electromagnetic noise component input end. The differential mode electromagnetic noise component input end is configured to input a differential mode electromagnetic noise component. The first injection end and the second injection end are connected to any two points that are connected in series in the differential mode loop in a one-to-one correspondence, and are configured to inject the differential mode electromagnetic noise component. The injection piece includes a semiconductor transistor or a winding differential mode inductor. A first electrode of the semiconductor transistor is the first injection end, a second electrode of the semiconductor transistor is the second injection end, and a control pole of the semiconductor transistor is the differential mode electromagnetic noise component input end. The winding differential anode inductor includes a first winding and a second winding. One end of the first winding is the differential mode electromagnetic noise component input end, and the other end of the first winding is grounded. One end of the second winding is the first injection end, and the other end of the second winding is the second injection end.

Further, the injection piece is a two-winding differential mode inductor, and a first winding and a second winding of the two-winding differential mode inductor are a primary winding and a secondary winding, respectively. One end of the primary winding is the differential mode electromagnetic noise component input end, and the other end of the primary winding is grounded. One end of the secondary winding is the first injection end, and the other end of the secondary winding is the second injection end.

Further, the injection piece includes a three-winding differential mode inductor, and three windings of the three-winding differential mode inductor are a first winding and two second windings, respectively. The first winding is a primary winding, and the two second windings are a first secondary winding and a second secondary winding, respectively. The first secondary winding and the second secondary winding are opposite to each other and have opposite polarities. One end of the primary winding is the differential mode electromagnetic noise component input end, and the other end of the primary winding is grounded. Each of a first end of the first secondary winding and a first end of the second secondary winding is the first injection end, and each of a second end of the first secondary winding and a second end of the second secondary winding is the second injection end.

Further, the differential mode loop includes a Live wire, a Neutral wire, a rectifier bridge and a capacitor. The Live wire and the Neutral wire are both connected to the rectifier bridge, and the capacitor is connected between a positive electrode and a negative electrode of the rectifier bridge. An injection point corresponding to the first injection end of the injection piece is located on the Live wire, the Neutral wire, a connection line between the capacitor and the positive electrode of the rectifier bridge, or a connection line between the capacitor and the negative electrode of the rectifier bridge. An injection point corresponding to the second injection end of the injection piece is located on the Live wire, the Neutral wire, the connection line between the capacitor and the positive electrode of the rectifier bridge, or the connection line between the capacitor and the negative electrode of the rectifier bridge.

Further, the differential mode loop includes a Live wire, a Neutral wire, a rectifier bridge and a capacitor. The Live wire and the Neutral wire are both connected to the rectifier bridge, and the capacitor is connected between a positive electrode and a negative electrode of the rectifier bridge. Two injection points corresponding to the first injection end and the second injection end are located on the Live wire and the Neutral wire, respectively. Alternatively, the two injection points corresponding to the first injection end and the second injection end are separately located on a connection line between the capacitor and the positive electrode of the rectifier bridge and a connection line between the capacitor and the negative electrode of the rectifier bridge.

Further, the differential mode loop includes an input positive electrode connection line, an input negative electrode connection line and a capacitor, and a current direction of the differential mode loop is from the input positive electrode connection line to the input negative electrode connection line via the capacitor. An injection point corresponding to the first injection end is located on the input positive electrode connection line or the input negative electrode connection line. An injection point corresponding to the second injection end is located on the input positive electrode connection line or the input negative electrode connection line.

Another aspect of the present invention further provides an active electromagnetic interference filter including the differential mode electromagnetic noise injection network mentioned above.

Further, the active electromagnetic interference filter further includes an electromagnetic noise converting network. The electromagnetic noise converting network includes a first resistor-capacitor network, a second resistor-capacitor network and an operational amplifier. A first end of the first resistor-capacitor network is configured to receive the differential mode electromagnetic noise component, and a second end of the first resistor-capacitor network is connected to a negative electrode input end of the operational amplifier. The second resistor-capacitor network is connected between the negative electrode input end and an output end of the operational amplifier. By a connection of the output end of the operational amplifier and the differential mode electromagnetic noise component input end of the injection piece of the differential mode electromagnetic noise injection network, the differential mode electromagnetic noise component processed by the electromagnetic noise converting network is input to the differential mode electromagnetic noise injection network.

Further, the active electromagnetic interference filter further includes a differential mode electromagnetic noise extracting network. The differential mode electromagnetic noise extracting network is connected to the electromagnetic noise converting network, and is configured to extract the differential mode electromagnetic noise component in an input cable and output the differential mode electromagnetic noise component to the electromagnetic noise converting network.

Compared with the prior art, the differential mode electromagnetic noise injection network and the active electromagnetic interference filter provided by the present invention have following advantages:

the differential mode electromagnetic noise injection network and the active electromagnetic interference filter provided by the present invention can extract a common mode electromagnetic noise and a differential mode electromagnetic noise in input cables, and perform gain and closed-loop feedback processing on the differential-common mode electromagnetic noise through an electromagnetic noise converting network; the processed differential mode electromagnetic noise returns to a differential mode noise source in the electrical equipment through a differential mode loop by a differential mode electromagnetic noise injection network, and the processed common mode electromagnetic noise returns to a common mode noise source in the electrical equipment through a common mode loop by a common mode electromagnetic noise injection network. In this way, the amount of electromagnetic noise of the electrical equipment entering a power supply system is minimized; the surrounding environment and the power supply grids are not affected by the electromagnetic noise of the electrical equipment; and meanwhile the electrical equipment is enabled to satisfy the limit values of the EMI regulations.

BRIEF DESCRIPTION OF THE DRAWINGS

In order to illustrate the technical solutions of the embodiments of the present invention or the prior art more clearly, the drawings required to be used in the description of the embodiments or the prior art will be introduced briefly below. Obviously, the following described drawings are some of the embodiments of the present invention, and other drawings may be obtained according to these drawings by those having ordinary skill in the art without exerting any creative effort.

REFERENCE SIGNS

Figure 1:
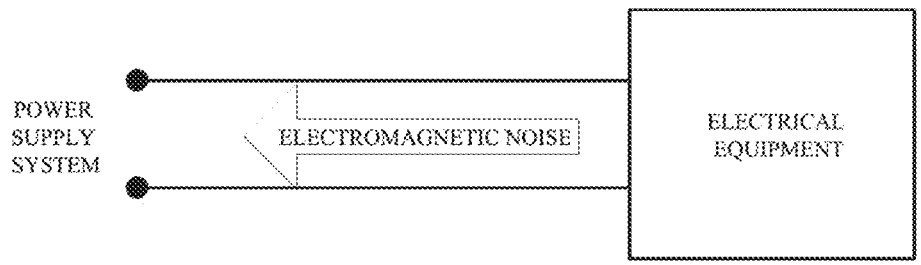
FIG. 1 is a schematic diagram of the connection between electrical equipment and a power supply system.
Figure 2:
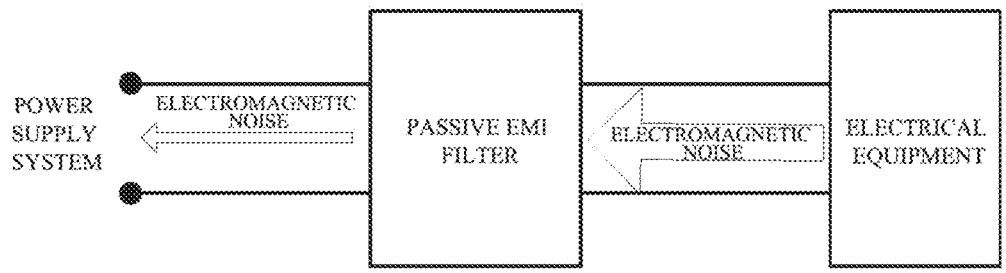
FIG. 2 is a application schematic diagram of a passive EMI filter in the prior art.
Figure 3:
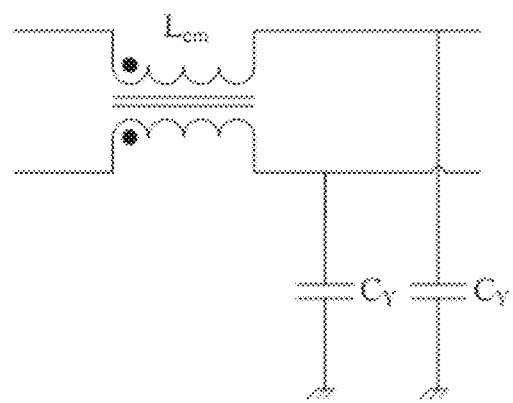
FIG. 3 is a schematic diagram of a common mode EMI filter in the prior art.
Figure 4:
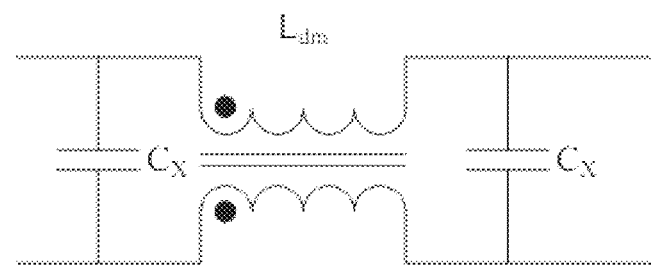
FIG. 4 is a schematic diagram of a differential mode EMI filter in the prior art.
Figure 5A:
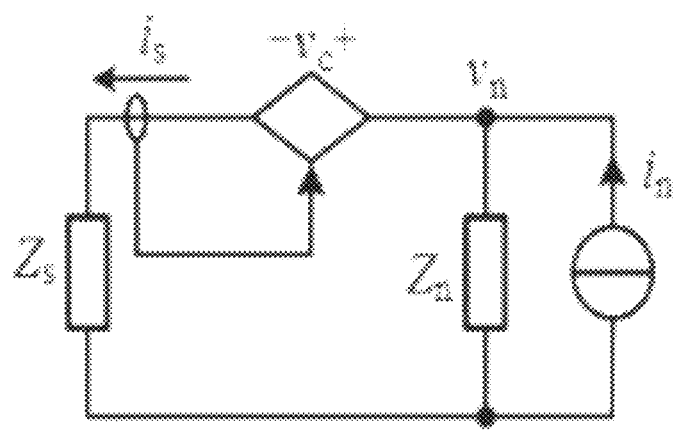
FIGS. 5A-5D are conceptual schematic diagrams showing an active EMI filter in the prior art.
Figure 5B:
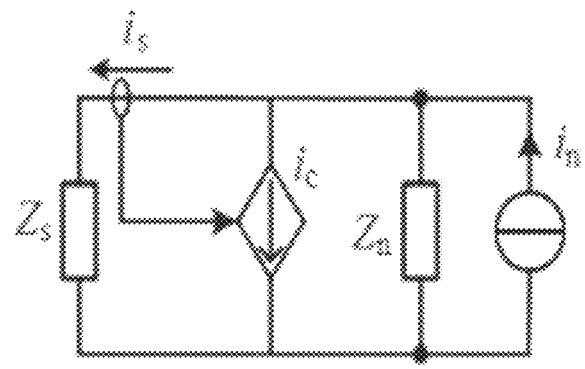
Figure 5C:
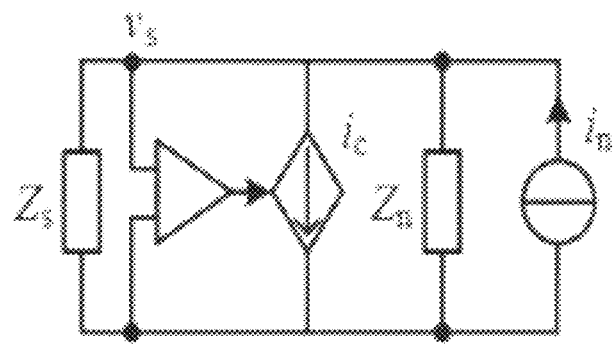
Figure 5D:
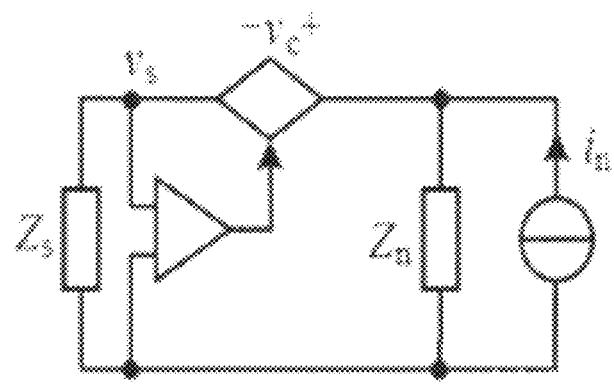
Figure 6:
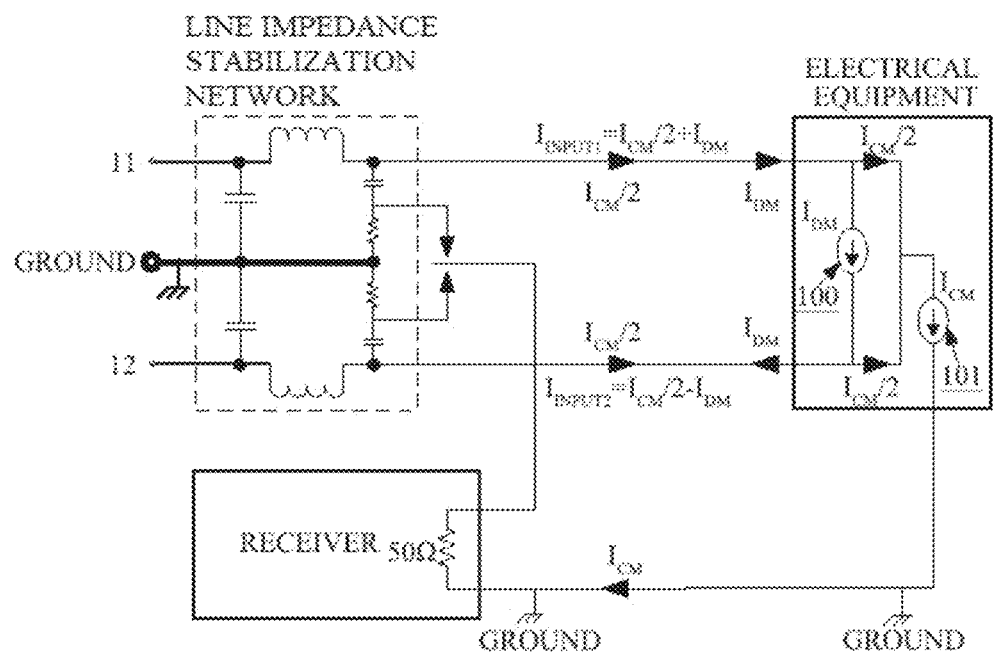
FIG. 6 is a setup diagram for a test of the standard conduction emission in the prior art.

100-differential mode electromagnetic noise source; 101-common mode electromagnetic noise source; 108-common mode electromagnetic noise component output end; 109-differential mode electromagnetic noise component output end; 11-first input cable; 12-second input cable; 111-electromagnetic noise of the first input cable; 121-electromagnetic noise of the second input cable; 21-electromagnetic noise processing network; 22-electromagnetic noise converting network; 23-differential mode electromagnetic noise injection network; 25-common mode electromagnetic noise injection network; 211-common mode electromagnetic noise extractor; 212-differential mode electromagnetic noise extractor; 213-electromagnetic noise sampler; 214-differential-common mode electromagnetic noise extracting network; 215-first sampler; 216-second sampler; 33-first operational amplifier; 34-second operational amplifier; 35-first resistor-capacitor network; and 36-second resistor-capacitor network.

DETAILED DESCRIPTION OF THE EMBODIMENTS

The technical solutions of the present invention are described clearly and completely below in conjunction with the drawings. Obviously, the described embodiments are a part, not all of the embodiments of the present invention. Based on the embodiments of the present invention, all the other embodiments obtained by those having ordinary skill in the art without exerting any creative effort shall fall within the scope of protection of the present invention.

In the description of the present invention, it should be explained that the terms "center", "upper/above", "lower/under", "left", "right", "vertical", "horizontal", "inner/inside/interior", "outer/outside/exterior", and other indicating the directional or positional relationships are based on the directional or positional relationships shown in the drawings, and are merely used to facilitate description, rather than indicating or implying that the device or element must have a specific orientation, be configured and operated in a specific orientation, and therefore cannot be construed as a limitation to the present invention. In addition, the terms "first", "second", and "third" are only used for descriptive purposes, and cannot be construed as indicating or implying relative importance.

In the description of the present invention, it should be explained that in the description of the present invention, unless otherwise clearly defined and limited, the terms "installed", "connected to", and "connection" should be interpreted in a broad sense. For example, with respect to "connection", it can be a fixed connection, a detachable connection, or an integral connection; it can be a mechanical connection or an electrical connection; it can be a direct connection, or an indirect connection through an intermediate medium, and it can be the internal communication between two components. For those skilled in the art, the specific meaning of the above-mentioned terms in the present invention can be understood according to specific implementations.

Figure 7:
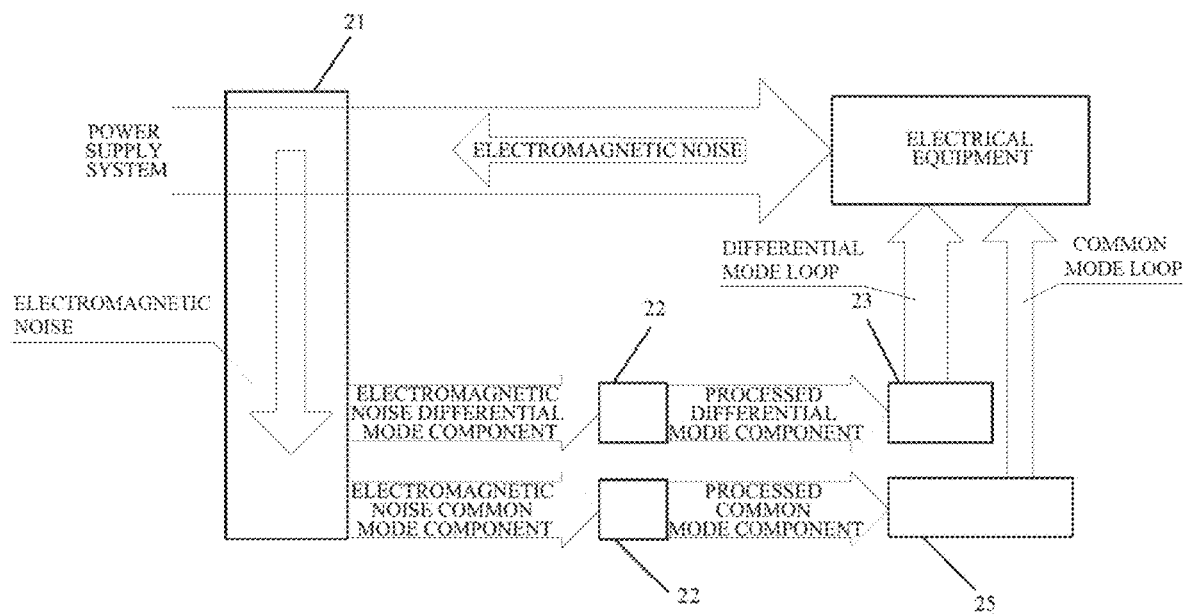
FIG. 7 is a schematic diagram of a filtering technique of an active EMI filter according to an embodiment of the present invention.

FIG. 7 is a schematic diagram of a filtering technique of an active EMI filter according to an embodiment of the present invention. Referring to FIG. 7, with respect to the shortcomings of the traditional passive EMI filter and the existing active EMI filter, an embodiment of the present invention proposes an active EMI filtering technique for separately suppressing differential mode and common mode electromagnetic noises, which is implemented by the active EMI filter in practice. The active EMI filter includes the electromagnetic noise processing network 21, the electromagnetic noise converting network 22, the differential mode electromagnetic noise injection network 23, and the common mode electromagnetic noise injection network 25.

In the active EMI filtering technique according to an embodiment of the present invention, after the differential mode electromagnetic noise and the common mode electromagnetic noise are separately extracted from input cables of electrical equipment through the electromagnetic noise processing network 21, they are separately fed to the electromagnetic noise converting network 22 for gain and closed-loop feedback processing. The processed differential mode electromagnetic noise returns to a differential mode noise source in the electrical equipment through a differential mode loop by the differential mode electromagnetic noise injection network 23, and the processed common mode electromagnetic noise returns to a common mode noise source in the electrical equipment through a common mode loop by the common mode electromagnetic noise injection network 25. In this way, internal circulation of the electromagnetic noise can be realized. The amount of electromagnetic noise of the electrical equipment entering a power supply system is minimized. The surrounding environment and the power supply grids are not affected by the electromagnetic noise of the electrical equipment, and meanwhile the electrical equipment meets the limit values of the EMI regulations.

The active EMI filtering technique according to an embodiment of the present invention has following key innovations.

1. The electromagnetic noise processing network 21 according to an embodiment of the present invention employs an independent extracting network of differential mode electromagnetic noise to input the differential mode electromagnetic noise to the post-stage electromagnetic noise converting network 22 for the gain and closed-loop feedback processing. The present invention provides various forms of differential mode electromagnetic noise extracting networks to cooperate with the post-stage electromagnetic noise converting network 22, differential mode electromagnetic noise injection network 23, and common mode electromagnetic noise injection network 25.

The differential mode electromagnetic noise processing network according to an embodiment of the present invention can realize an isolation greater than 60 dB from the common mode electromagnetic noise, corresponding to that, the common mode electromagnetic noise only accounts for less than 0.1% in the extracted differential mode electromagnetic noise, so that the electromagnetic noise suppression can achieve the expected suppression effect.

2. The electromagnetic noise processing network 21 according to an embodiment of the present invention employs an independent extracting network of common mode electromagnetic noise to input the common mode electromagnetic noise to the post-stage electromagnetic noise converting network 22 for the gain and closed-loop feedback processing.

The present invention provides various forms of common mode electromagnetic noise extracting networks to cooperate with the post-stage electromagnetic noise converting network 22 and the common mode electromagnetic noise injection network 25. The common mode electromagnetic noise extracting network according to an embodiment of the present invention can realize an isolation greater than 60 dB from the differential mode electromagnetic noise, corresponding to that, the differential mode electromagnetic noise only accounts for less than 0.1% in the extracted common mode electromagnetic noise, so that the electromagnetic noise suppression can achieve the expected suppression effect.

3. The active EMI filter according to an embodiment of the present invention employs an independent differential mode electromagnetic noise injection network 23 to inject the processed differential mode electromagnetic noise to the differential mode loop of the electrical equipment, and suppress the differential mode electromagnetic noise by changing a differential mode impedance of the differential mode loop. The present invention provides various forms of the differential mode electromagnetic noise injection networks 23 to inject the pre-processed differential mode electromagnetic noise to the differential mode loop of the electrical equipment, and suppress the electromagnetic noise by changing the differential mode impedance of the differential mode loop.

4. The active EMI filter according to an embodiment of the present invention employs an independent common mode electromagnetic noise injection network 25 to inject the processed common mode electromagnetic noise to the common mode loop of the electrical equipment, and the common mode electromagnetic noise returns to the common mode noise source in the electrical equipment to form internal circulation. The present invention provides various forms of the common mode electromagnetic noise injection networks 25 to inject the pre-processed common mode electromagnetic noise to the common mode loop of the electrical equipment, and the common mode electromagnetic noise returns to the common mode noise source in the electrical equipment to form internal circulation and suppress the electromagnetic noise.

5. In the active EMI filter according to an embodiment of the present invention, the differential mode electromagnetic noise injection point is flexible, that is, the differential mode electromagnetic noise can be injected at any point in a differential mode loop from the input cables to the post-stage electrical equipment, and the electromagnetic noise is suppressed by changing the differential mode impedance in the differential mode loop.

6. In the active EMI filter according to an embodiment of the present invention, the common mode electromagnetic noise injection point is flexible, that is, the common mode electromagnetic noise can be injected at any point in a common mode loop from the input cables to the post-stage electrical equipment, and then the common mode electromagnetic noise returns to the common mode electromagnetic noise source in the electrical equipment, to form internal circulation and suppress the electromagnetic noise.

The various forms of the electromagnetic noise processing networks 21, differential mode electromagnetic noise injection networks 23 and common mode electromagnetic noise injection networks 25 and the flexible electromagnetic noise injection point according to an embodiment of the present invention are described below one by one.

The followings are various manners of implementation of the electromagnetic noise processing network 21.

The electromagnetic noise processing network 21 adopted by the active EMI filter according to an embodiment of the present invention includes an electromagnetic noise extracting network. The electromagnetic noise extracting network has two main implementation manners as follows: a direct extracting network and an indirect extracting network, or correspondingly called as a single-stage extracting network and a two-stage extracting network, for extracting a differential mode electromagnetic noise and a common mode electromagnetic noise.

The electromagnetic noise extracting network includes a common mode electromagnetic noise extractor and a differential mode electromagnetic noise extractor. The common mode electromagnetic noise extractor is configured to extract and output the common mode electromagnetic noise of the input cable. The differential mode electromagnetic noise extractor is configured to extract and output the differential mode electromagnetic noise of the input cable.

In the single-stage extracting network, the common mode electromagnetic noise extractor is configured to directly extract and output the common mode electromagnetic noise of the input cable, and the differential mode electromagnetic noise extractor is configured to directly extract and output the differential mode electromagnetic noise of the input cable.

In the two-stage extracting network, the common mode electromagnetic noise extracting network is configured to indirectly extract and output the common mode electromagnetic noise of the input cable, and the differential mode electromagnetic noise extractor is configured to indirectly extract and output the differential mode electromagnetic noise of the input cable.

Figure 8:
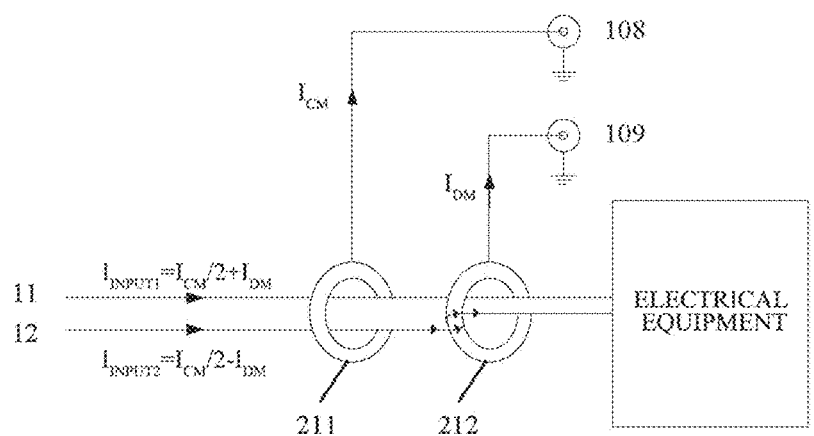
FIG. 8 is a schematic diagram of a first implementation manner of an electromagnetic noise processing network according to an embodiment of the present invention.

FIG. 8 is a schematic diagram when the electromagnetic noise processing network according to an embodiment of the present invention is the single-stage extracting network. Referring to FIG. 8, the single-stage extracting network includes the common mode electromagnetic noise extractor 211 and the differential mode electromagnetic noise extractor 212. In some embodiments, each of the common mode electromagnetic noise extractor 211 and the differential mode electromagnetic noise extractor 212 is a current transformer. The first input cable 11 successively passes through the inner ring of the common mode electromagnetic noise extractor 211 and the inner ring of the differential mode electromagnetic noise extractor 212, and then is connected to the electrical equipment. The second input cable 12 first passes through the inner ring of the common mode electromagnetic noise extractor 211, is wound around the ring body of the differential mode electromagnetic noise extractor 212 for one circle along the thickness direction of the differential mode electromagnetic noise extractor 212, and then is connected to the electrical equipment.

Since the first input cable 11 and the second input cable 12 simultaneously pass through the inner ring of the common mode electromagnetic noise extractor 211, according to a law of a current loop, the output current of the common mode electromagnetic noise extractor 211 is equivalent to a sum of currents of the two input cables in the inner ring thereof. Since $I_{input1}+I_{input2}=(I_{CM}/2+I_{DM})+(I_{CM}/2-I_{DM})=I_{CM}$, the output current of the common mode electromagnetic noise extractor 211 is the common mode electromagnetic noise current $I_{CM}$.

With respect to the differential mode electromagnetic noise extractor 212, according to a direction of the input cable in its inner ring and a direction in which the current flows in the cable, it can be obtained that the output current of the differential mode electromagnetic noise extractor 212 is: $I_{input1}-I_{input2}=(I_{CM}/2+I_{DM})-(I_{CM}/2-I_{DM})=I_{DM}$, that is, the output current of the differential mode electromagnetic noise extractor 212 is the differential mode electromagnetic noise current $I_{DM}$.

The common mode electromagnetic noise current $I_{CM}$ output by the common mode electromagnetic noise extractor 212 and the differential mode electromagnetic noise current $I_{DM}$ output by the differential mode electromagnetic noise extractor 212 are output into the electromagnetic noise converting network 22 of a next stage for gain and closed-loop feedback processing.

Figure 9:
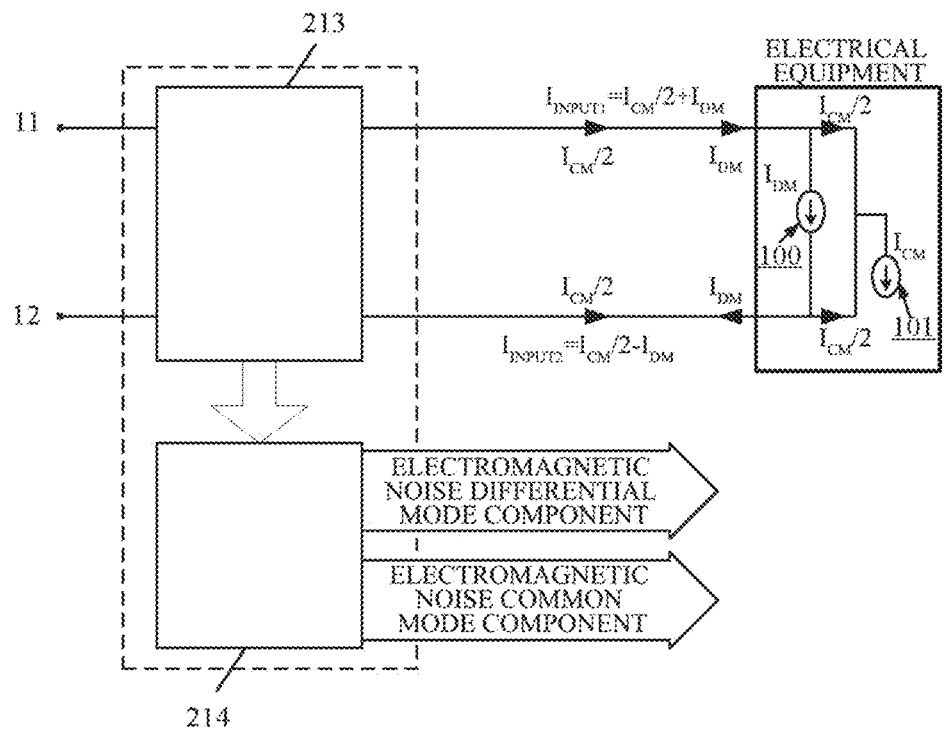
FIG. 9 is a schematic diagram of a second implementation manner of an electromagnetic noise processing network according to an embodiment of the present invention.

FIG. 9 is a schematic diagram when the electromagnetic noise processing network according to an embodiment of the present invention is the two-stage extracting network. Referring to FIG. 9, the two-stage extracting network includes the electromagnetic noise sampling network 213 and the differential-common mode electromagnetic noise extracting network 214. Specifically, the electromagnetic noise sampling network 213 is arranged between the input cables and the differential-common mode electromagnetic noise extracting network 214. The electromagnetic noise sampling network 213 is configured to sample the differential-common mode electromagnetic noise of the input cables and output the sampled differential-common mode electromagnetic noise to the differential-common mode electromagnetic noise extracting network 214.

The differential-common mode electromagnetic noise extracting network 214 corresponds to the single-stage extracting network of the embodiment as shown in FIG. 8, and includes the common mode electromagnetic noise extractor 211 and the differential mode electromagnetic noise extractor 212. The common mode electromagnetic noise extractor 211 is configured to extract and output the common mode electromagnetic noise in the differential-common mode electromagnetic noise sampled by the electromagnetic noise sampling network 213, such as a common mode electromagnetic noise component as shown in FIG. 9. The differential mode electromagnetic noise extractor 212 is configured to extract and output the differential mode electromagnetic noise in the differential-common mode electromagnetic noise sampled by the electromagnetic noise sampling network 213, such as a differential mode electromagnetic noise component as shown in FIG. 9.

The electromagnetic noise sampling network 213 extracts a total electromagnetic noise on each input cable, and then outputs the total electromagnetic noise to the differential-common mode electromagnetic noise extracting network 214. The differential-common mode electromagnetic noise extracting network 214 isolates the common mode electromagnetic noise and the differential mode electromagnetic noise, respectively, and then outputs the common mode electromagnetic noise and the differential mode electromagnetic noise to the electromagnetic noise converting network 22 of a next stage for gain and closed-loop feedback processing. The total electromagnetic noise on each input cable includes the differential mode electromagnetic noise and the common mode electromagnetic noise.

The electromagnetic noise sampling network 213 can sample the total electromagnetic noise on each input cable in various manners. Various implementation manners of the electromagnetic noise sampling network 213 can be, as needed practically, arbitrarily combined with various implementation manners of the post-stage differential-common mode electromagnetic noise extracting network 214 to obtain the pure differential mode electromagnetic noise and common mode electromagnetic noise as the inputs of the post-stage electromagnetic noise converting network 22.

According to an embodiment of the present invention, the electromagnetic noise sampling network 213 can be implemented in two manners.

Figure 10:
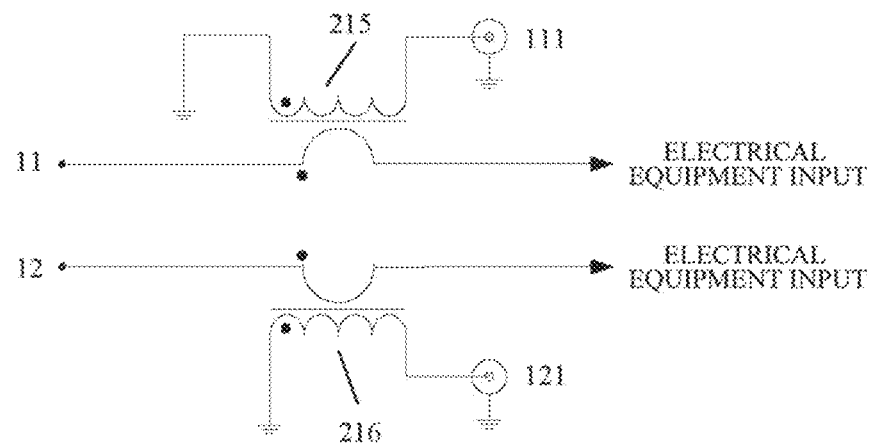
FIG. 10 is a schematic diagram of a first implementation manner of an electromagnetic noise sampling network according to an embodiment of the present invention.

FIG. 10 is a schematic diagram of a first implementation manner of the electromagnetic noise sampling network according to an embodiment of the present invention. Referring to FIG. 10, in the first implementation manner, the electromagnetic noise sampling network 213 includes the first sampler 215 and the second sampler 216. The first sampler 215 is arranged on the first input cable 11, and the first sampler 215 is connected to the common mode electromagnetic noise extractor 211 or the differential mode electromagnetic noise extractor 212. The second sampler 216 is arranged on the second input cable 12, and the second sampler 216 is connected to the common mode electromagnetic noise extractor 211 or the differential mode electromagnetic noise extractor 212.

In some embodiments, each of the first sampler 215 and the second sampler 216 may be a current transformer. The current transformer samples the electromagnetic noise current on the input cable that is put there into, and the electromagnetic noise obtained in this way includes the common mode electromagnetic noise and the differential mode electromagnetic noise in the input cable.

Figure 11:
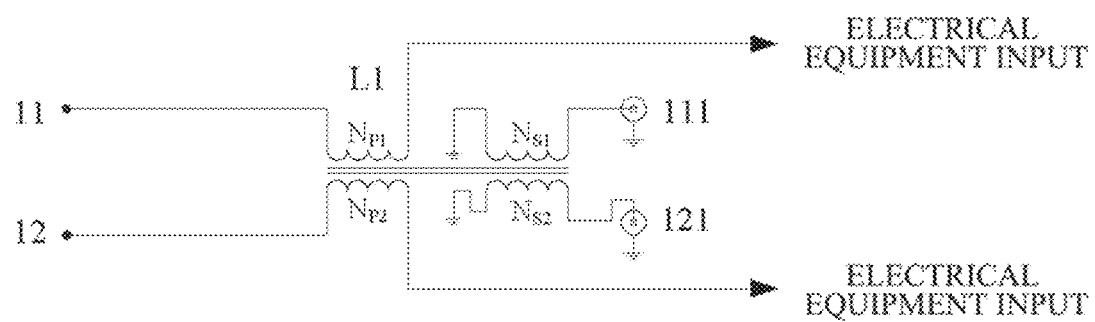
FIG. 11 is a schematic diagram of a second implementation manner of an electromagnetic noise sampling network according to an embodiment of the present invention.

FIG. 11 is a schematic diagram of a second implementation manner of the electromagnetic noise sampling network according to an embodiment of the present invention. Referring to FIG. 11, in the second implementation manner, the electromagnetic noise sampling network 213 includes an inductor $L_1$, and the inductor $L_1$ includes two primary windings $N_{P1}$ and $N_{P2}$ and two secondary sampling windings $N_{S1}$ and $N_{S2}$, wherein one primary winding $N_{P1}$ is connected in series between the first input cable 11 and the electrical equipment, and the other primary winding $N_{P2}$ is connected in series between the second input cable 12 and the electrical equipment; and the two secondary sampling windings $N_{S1}$ and $N_{S2}$ are separately coupled with the two primary windings $N_{P1}$ and $N_{P2}$ in a one-to-one correspondence, and each of the two second ends of the two secondary sampling windings $N_{S1}$ and $N_{S2}$ is configured to output the differential-common mode electromagnetic noise of the corresponding input cable.

Specifically, the electromagnetic noise sampling network 213 employs an inductor plus the coupling windings to obtain the electromagnetic noise on each input cable, wherein the inductor $L_1$ is formed by four windings, which are the primary windings $N_{P1}$ and $N_{P2}$ and the secondary sampling windings $N_{S1}$ and $N_{S2}$, respectively. The primary winding $N_{P1}$ and the secondary sampling winding $N_{S1}$ adopt a tightly coupling winding manner to achieve high coupling coefficient. The primary winding $N_{P2}$ and the secondary sampling winding $N_{S2}$ adopt the tightly coupling winding manner to achieve high coupling coefficient.

The primary winding $N_{P1}$ is connected in series between the first input cable 11 and the input of the electrical equipment, and the primary winding $N_{P2}$ is connected in series between the second input cable 12 and the input of the electrical equipment. After one end of each of the secondary sampling windings $N_{S1}$ and $N_{S2}$ is grounded, the other end of each of the secondary sampling windings $N_{S1}$ and $N_{S2}$ outputs the electromagnetic noise coupled to the corresponding input cable. The electromagnetic noise obtained in this way may include the common mode electromagnetic noise and the differential mode electromagnetic noise in the cable.

Implementation manners of the differential-common mode electromagnetic noise extracting network 214 are as follows.

The differential-common mode electromagnetic noise extracting network 214 can perform isolation in various manners to obtain the pure differential mode electromagnetic noise and common mode electromagnetic noise as the inputs of the post-stage electromagnetic noise converting network 22. Various implementation manners of the differential-common electromagnetic noise extracting network 214 can be, as needed practically, combined with various implementation manners of the previous-stage electromagnetic noise sampling network 213 to obtain the pure differential mode electromagnetic noise and common mode electromagnetic noise as the inputs of the post-stage electromagnetic noise converting network 22.

There are two implementation manners of the differential-common mode electromagnetic noise extracting network 214, namely a winding coupling voltage cancellation manner and an operational amplifier algebraic sum manner.

Figure 12:
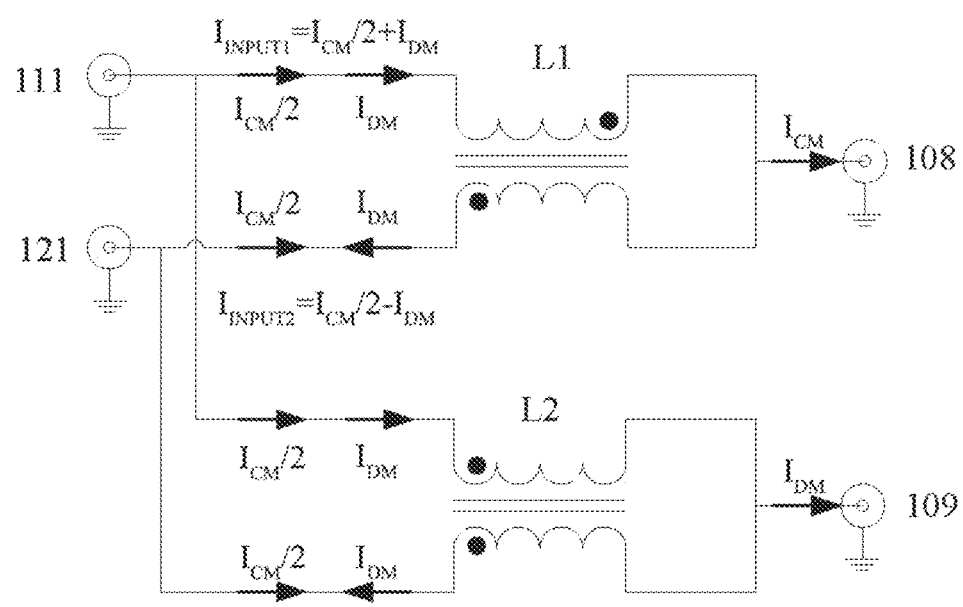
FIG. 12 is a schematic diagram of a first implementation manner of an electromagnetic noise extracting network according to an embodiment of the present invention.

FIG. 12 is a schematic diagram of a first implementation manner of an electromagnetic noise extracting network according to an embodiment of the present invention. Referring to FIG. 12, the differential-common mode electromagnetic noise extracting network 214 can be implemented by a coupling induction voltage cancellation manner of a magnetic device to obtain the pure differential mode electromagnetic noise and common mode electromagnetic noise. Specifically, the common mode electromagnetic noise extractor and the differential mode electromagnetic noise extractor both are two-winding inductors, which are $L_1$ and $L_2$, respectively. Polarities of two windings of the two-winding inductor $L_1$ adopted by the common mode electromagnetic noise extractor are opposite, wherein, the first ends of the two windings of the common mode electromagnetic noise extractor are configured to receive the differential-common mode electromagnetic noise of the first input cable 11 and the second input cable 12, respectively, and the second ends of the two windings of the common mode electromagnetic noise extractor both are configured to output the common mode electromagnetic noise. Polarities of two windings of the two-winding inductor $L_2$ adopted by the differential mode electromagnetic noise extractor are identical, wherein, the first ends of the two windings of the differential mode electromagnetic noise extractor are configured to receive the differential-common mode electromagnetic noise of the first input cable 11 and the second input cable 12, respectively, and the second ends of the two windings of the differential mode electromagnetic noise extractor both are configured to output the differential mode electromagnetic noise.

First, the one ends with opposite polarities of the two windings of the two-winding inductor $L_1$ are separately connected to the electromagnetic noise 111 of the first input cable 11 and the electromagnetic noise 121 of the second input cable 12 output by the previous-stage electromagnetic noise sampling network 213; and the other ends of the two windings of the two-winding inductor $L_1$ are connected to output the common mode electromagnetic noise.

Since the common mode currents in the first input cable 11 and the second input cable 12 are in an identical direction, while the differential mode currents in the first input cable 11 and the second input cable 12 are in opposite directions, according to a principle of magnetism, induction voltages generated by the common mode currents of the identical direction of the first input cable 11 and the second input cable 12 in a winding of a magnetic core in the two-winding inductor $L_1$ cancel each other, in other words, it has no suppression effect on the common mode currents, but has suppression effect on the differential mode currents. Thus, the differential mode electromagnetic noise can be isolated through such a connection manner of the two-winding inductor $L_1$ to obtain the pure common mode electromagnetic noise.

According to the above principle of isolating the differential mode electromagnetic noise, the common mode electromagnetic noise can also be isolated. First, the ends with the identical polarity of the two windings of the two-winding inductor $L_2$ are separately connected to the electromagnetic noise 111 of the first input cable 11 and the electromagnetic noise 121 of the second input cable 12 output by the previous-stage electromagnetic noise sampling network 213; and the other ends of the two windings of the two-winding inductor $L_2$ are connected to output the differential mode electromagnetic noise.

Since the differential mode currents in the first input cable 11 and the second input cable 12 are in opposite directions, while the common mode currents in the first input cable 11 and the second input cable 12 are in an identical direction, according to the principle of magnetism, induction voltages generated by the differential mode currents of the identical direction of the first input cable 11 and the second input cable 12 in a winding of a magnetic core in the two-winding inductor $L_2$ cancel each other, in other words, it has no suppression effect on the differential mode currents, but has suppression effect on the common mode currents. Thus, the common mode electromagnetic noise can be isolated through such a connection manner of the two-winding inductor $L_2$ to obtain the pure differential mode electromagnetic noise.

Figure 13:
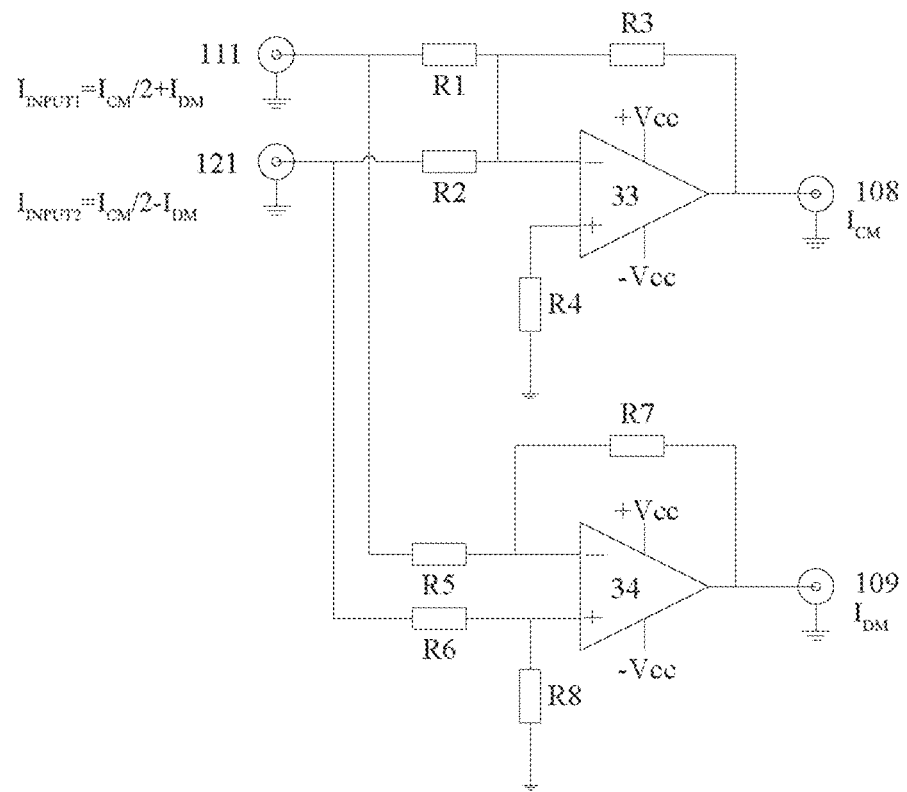
FIG. 13 is a schematic diagram of a second implementation manner of an electromagnetic noise extracting network according to an embodiment of the present invention.

FIG. 13 is a schematic diagram of a second implementation manner of the electromagnetic noise extracting network according to an embodiment of the present invention. Referring to FIG. 13, the differential-common mode electromagnetic noise extracting network 214 can also be implemented by an operational amplifier algebraic sum manner to obtain the pure differential mode electromagnetic noise and common mode electromagnetic noise.

The first operational amplifier 33, the first resistor $R_1$, the second resistor $R_2$, the third resistor $R_3$ and the fourth resistor $R_4$ are adopted to isolate the differential mode electromagnetic noise while the common mode electromagnetic noise is output. The negative electrode input end of the first operational amplifier 33 is connected to the first resistor $R_1$, the second resistor $R_2$ and the third resistor $R_3$. The positive electrode input end of the first operational amplifier 33 is connected to the fourth resistor $R_4$, and is grounded via the fourth resistor $R_4$. The output end of the first operational amplifier 33 is connected to the third resistor $R_3$ and simultaneously serves as the common mode electromagnetic noise component output end 108. The other end of the first resistor $R_1$ is connected to the electromagnetic noise 111 of the first input cable 11, and the other end of the second resistor $R_2$ is connected to the electromagnetic noise 121 of the second input cable 12. The algebraic addition can be implemented according to the connection manner of the operational amplifier and the resistor network, that is, the algebraic addition $I_{input1}+I_{input2}$ is performed on the electromagnetic noise current $I_{input1}$ of the first input cable 11 and the electromagnetic noise current $I_{input2}$ of the second input cable 12, to obtain the common mode electromagnetic noise $I_{CM}$ and isolate the differential mode electromagnetic noise $I_{DM}$.

According to the above method of obtaining the common mode electromagnetic noise, a subtraction can also be implemented to obtain the differential mode electromagnetic noise, while the common mode electromagnetic noise is isolated.

The second operational amplifier 34, the fifth resistor $R_5$, the sixth resistor $R_6$, the seventh resistor $R_7$ and the eighth resistor $R_8$ are adopted to isolate the common mode electromagnetic noise while the differential mode electromagnetic noise is output. The negative electrode input end of the second operational amplifier 34 is connected to the fifth $R_5$ and the seventh resistor $R_7$. The positive electrode input end of the second operational amplifier 34 is connected to the sixth resistor $R_6$ and the eighth resistor $R_8$, and is grounded via the eighth resistor $R_8$. The output end of the second operational amplifier 34 is connected to the seventh resistor $R_7$ and simultaneously serves as the differential mode electromagnetic noise component output end 109. The other end of the fifth resistor $R_5$ is connected to the electromagnetic noise 111 of the first input cable 11, and the other end of the sixth resistor $R_6$ is connected to the electromagnetic noise 121 of the second input cable 12.

The algebraic subtraction can be implemented according to the connection manner of the operational amplifier and the resistor network, that is, the algebraic subtraction $I_{input1}-I_{input2}$ is performed on the electromagnetic noise current $I_{input1}$ of the first input cable 11 and the electromagnetic noise current $I_{input2}$ of the second input cable 12 to obtain the differential mode electromagnetic noise $I_{DM}$ and isolate the common mode electromagnetic noise $I_{CM}$.

The implementation manner of the operational amplifier algebraic sum as illustrated above is one of the implementation manners for implementing the algebraic addition and the algebraic subtraction of the common mode electromagnetic noise and the differential mode electromagnetic noise in the input cable.

Specifically, +Vcc and −Vcc involved in the figures of the present embodiment represent a positive power source and a negative power source, respectively.

The followings are various manners of implementation of the differential mode electromagnetic noise injection network 23.

The differential mode electromagnetic noise injection network 23 can be implemented in various ways, including: forms of a semiconductor transistor and a differential mode inductor. The differential mode electromagnetic noise injection network 23 includes an injection piece, and the injection piece is at least provided with a first injection end, a second injection end and a differential mode electromagnetic noise component input end. In the present embodiment, the first injection end is preferably an input cable connection end for connecting the input cable, and the second injection end is preferably an electrical equipment connection end for connecting the electrical equipment. Alternatively, the first injection end and the second injection end mentioned above can be connected to the injection points of the differential mode loop of other forms, such as a line in a circuit after the rectifier bridge. The differential mode electromagnetic noise component input end is configured to input the differential mode electromagnetic noise component from the electromagnetic noise converting network. The injection piece is configured to suppress the noise of the differential mode electromagnetic noise component.

Figure 14:
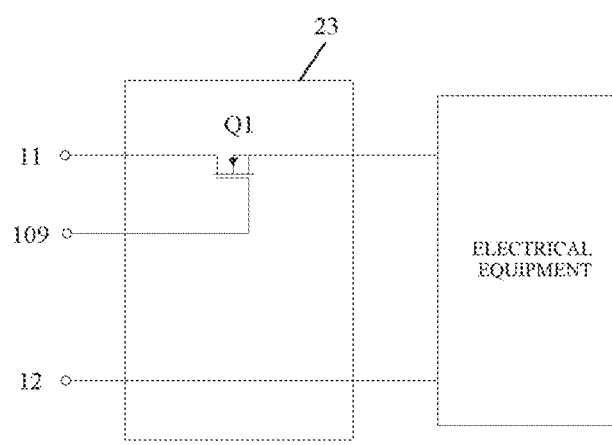
FIG. 14 is a schematic diagram of a differential mode electromagnetic noise injection network based on a semiconductor transistor according to an embodiment of the present invention.

FIG. 14 is a schematic diagram of a differential mode electromagnetic noise injection network based on a semiconductor transistor according to an embodiment of the present invention. Referring to FIG. 14, in the differential mode electromagnetic noise injection network 23 based on the semiconductor transistor, the semiconductor transistor is the field-effect transistor $Q_1$. The drain of the field-effect transistor $Q_1$ connected to the first input cable 11. The source of the field-effect transistor $Q_1$ is connected to the electrical equipment, and the gate of the field-effect transistor $Q_1$ is connected to the differential mode electromagnetic noise component output end 109 of the previous-stage electromagnetic noise converting network 22.

In the present embodiment, the field-effect transistor $Q_1$ is the injection piece of the differential mode electromagnetic noise injection network 23. The drain of the field-effect transistor $Q_1$ is the first injection end. The source of the field-effect transistor $Q_1$ is the second injection end, and the gate of the field-effect transistor $Q_1$ is the differential mode electromagnetic noise component input end.

The active EMI filter according to an embodiment of the present invention can use a variation of the gate voltage of the field-effect transistor $Q_1$ to adjust a differential mode impedance on the first input cable 11 to suppress the differential mode electromagnetic noise.

Since the first input cable 11 and the second input cable 12 are located in the same differential mode loop, the field-effect transistor $Q_1$ can be placed at any position in the differential mode loop to suppress the differential mode electromagnetic noise. For example, the field-effect transistor $Q_1$ is placed on the second input cable 12, or in the differential mode loop of the post-stage electrical equipment.

Figure 15:
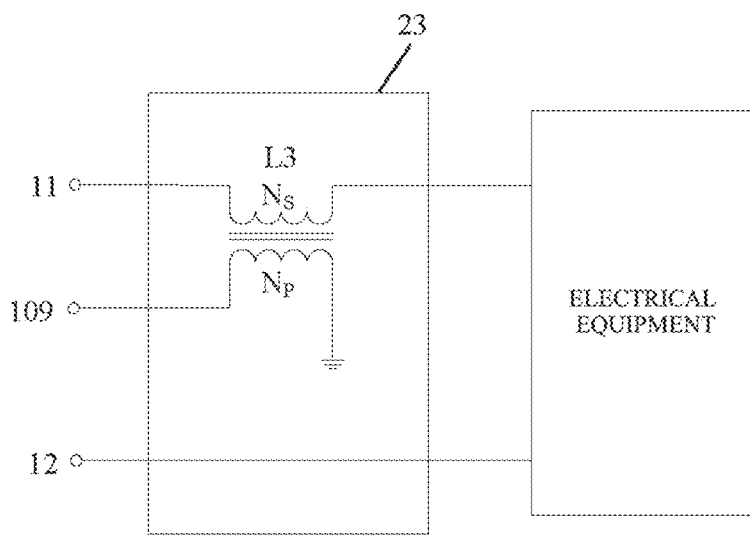
FIG. 15 is a schematic diagram of a differential mode electromagnetic noise injection network based on a two-winding differential mode inductor according to an embodiment of the present invention.

FIG. 15 is a schematic diagram of a differential mode electromagnetic noise injection network based on a two-winding differential mode inductor according to an embodiment of the present invention. Referring to FIG. 15, in the differential mode electromagnetic noise injection network 23 based on the two-winding differential mode inductor, the differential mode inductor $L_3$ includes two windings, i.e., the primary winding $N_P$ and the secondary winding $N_S$. One end of the primary winding $N_P$ of the two-winding differential mode inductor $L_3$ is connected to the differential mode electromagnetic noise component output end 109 of the previous-stage electromagnetic noise converting network 22, and the other end of the primary winding $N_P$ of the two-winding differential mode inductor $L_3$ is grounded. One end of the secondary winding $N_S$ of the two-winding differential mode inductor $L_3$ is connected to the first input cable 11, and the other end of the secondary winding $N_S$ of the two-winding differential mode inductor $L_3$ is connected to the post-stage electrical equipment.

In the present embodiment, the two-winding differential mode inductor is the injection piece of the differential mode electromagnetic noise injection network 23, and the two-winding differential mode inductor includes a first winding and a second winding. The first winding is the primary winding $N_P$, and the second winding is the secondary winding $N_S$. One end of the primary winding $N_P$ is the differential mode electromagnetic noise component input end, and the other end of the primary winding $N_P$ is grounded. One end of the secondary winding $N_S$ is the first injection end, and the other end of the secondary winding $N_S$ is the second injection end.

The active EMI filter according to an embodiment of the present invention can use the primary winding $N_P$ of the two-winding differential mode inductor $L_3$ to couple the differential mode component of the previous-stage electromagnetic noise converting network 22 to the differential mode loop where the secondary winding $N_S$ of the two-winding differential mode inductor $L_3$ is located to change the differential mode impedance of the differential mode loop, thereby suppressing the differential mode noise.

Figure 16:
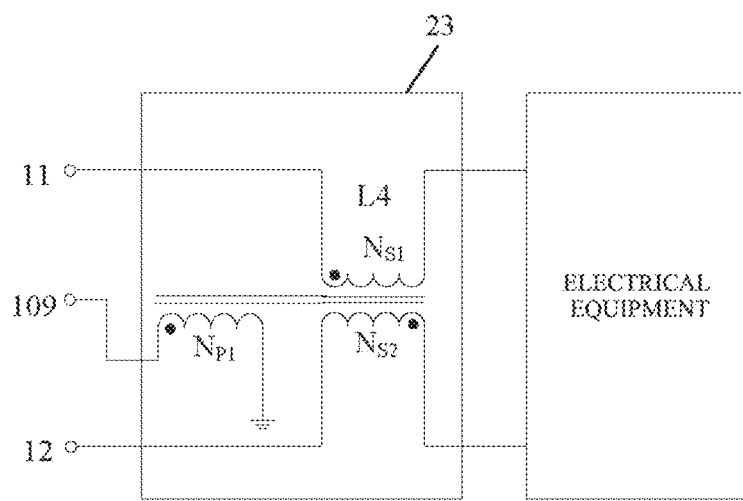
FIG. 16 is a schematic diagram of a differential mode electromagnetic noise injection network based on a three-winding differential mode inductor according to an embodiment of the present invention.

FIG. 16 is a schematic diagram of a differential mode electromagnetic noise injection network based on a three-winding differential mode inductor according to an embodiment of the present invention. Referring to FIG. 16, in the differential mode electromagnetic noise injection network based on the three-winding differential mode inductor, the three-winding differential mode inductor $L_4$ includes three windings, i.e., the primary winding $N_{P1}$, the first secondary winding $N_{S1}$ and the second secondary winding $N_{S2}$. One end of the primary winding $N_{P1}$ of the three-winding differential mode inductor $L_4$ is connected to the differential mode electromagnetic noise component output end 109 of the previous-stage electromagnetic noise converting network 22, and the other end of the primary winding $N_{P1}$ of the three-winding differential mode inductor $L_4$ is grounded. One end of the first secondary winding $N_{S1}$ of the three-winding differential mode inductor $L_4$ is connected to the first input cable 11, and the other end of the first secondary winding $N_{S1}$ of the three-winding differential mode inductor $L_4$ is connected to the post-stage electrical equipment. One end of the second secondary winding $N_{S2}$ of the three-winding differential mode inductor $L_4$ is connected to the second input cable 12, and the other end of the second secondary winding $N_{S2}$ of the three-winding differential mode inductor $L_4$ is connected to the post-stage electrical equipment.

In the present embodiment, the three-winding differential mode inductor is the injection piece of the differential mode electromagnetic noise injection network 23, and the three-winding differential mode inductor includes a first winding and two second windings. The first winding is the primary winding $N_P$, and the second windings are the first secondary winding $N_{S1}$ and the second secondary winding $N_{S2}$, respectively. The first secondary winding $N_{S1}$ and the second secondary winding $N_{S2}$ are opposite to each other and have opposite polarities. One end of the primary winding $N_P$ is the differential mode electromagnetic noise component input end, and the other end of the primary winding $N_P$ is grounded. Each of a first end of the first secondary winding $N_{S1}$ and a first end of the second secondary winding $N_{S2}$ is the first injection end, and each of a second end of the first secondary winding $N_{S1}$ and a second end of the second secondary winding $N_{S2}$ is the second injection end.

The active EMI filter according to an embodiment of the present invention can use the primary winding $N_{P1}$ of the three-winding differential mode inductor $L_4$ to couple the differential mode electromagnetic noise component output end 109 of the previous-stage electromagnetic noise converting network 22 to the differential mode loop where the first secondary winding $N_{S1}$ and the second secondary winding $N_{S2}$ of the three-winding differential mode inductor $L_4$ are located to change the differential mode impedance of the differential mode loop, thereby suppressing the differential mode noise.

The followings are implementation manners of the common mode electromagnetic noise injection network 25.

The common mode electromagnetic noise injection network 25 can also be implemented in various manners, including: the common mode electromagnetic noise injection network 25 based on a capacitor, the common mode electromagnetic noise injection network 25 based on a grounded capacitor, and the common mode electromagnetic noise injection network 25 based on a common mode inductor.

Figure 17:
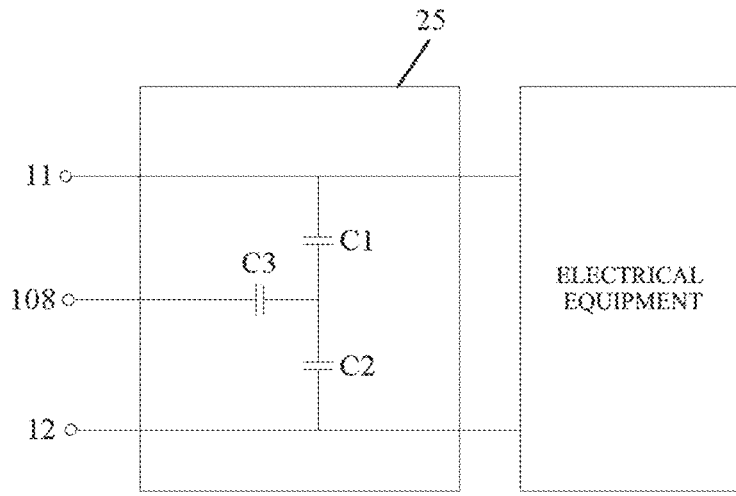
FIG. 17 is a schematic diagram of a common mode electromagnetic noise injection network based on a capacitor according to an embodiment of the present invention.

FIG. 17 is a schematic diagram of a common mode electromagnetic noise injection network based on a capacitor according to an embodiment of the present invention. Referring to FIG. 17, in the common mode electromagnetic noise injection network 25 based on the capacitor, one end of the first capacitor $C_1$, one end of the second capacitor $C_2$ and one end of the third capacitor $C_3$ are connected together. The other end of the first capacitor $C_1$ is connected to the first input cable 11 and the post-stage electrical equipment. The other end of the second capacitor $C_2$ is connected to the second input cable 12 and the post-stage electrical equipment, and the other end of the third capacitor $C_3$ is connected to the common mode electromagnetic noise component output end 108 of the previous-stage electromagnetic noise converting network 22.

The active EMI filter according to an embodiment of the present invention can inject the common mode electromagnetic noise component output end 108 of the previous-stage electromagnetic noise converting network 22 to a common mode loop through the first capacitor $C_1$, the second capacitor $C_2$ and the third capacitor $C_3$. This enables the common mode current to flow back to the post-stage electrical equipment, thereby suppressing the common mode electromagnetic noise and realizing that an EMI receiver is caused to detect a small amount of the common mode noise or not detect the common mode noise.

Since the connection manner of the common mode electromagnetic noise injection network 25 based on a capacitor does not need to involve the ground, the common mode electromagnetic noise injection network 25 based on the capacitor can not only adapt to being input to Class I electrical equipment with the ground, but also adapt to being input to Class II electrical equipment without the ground as well as the electrical equipment with DC power supply.

Figure 18:
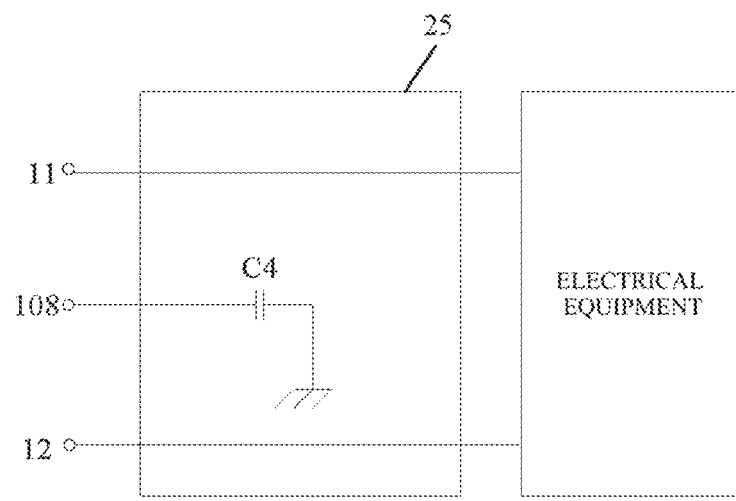
FIG. 18 is a schematic diagram of the common mode electromagnetic noise injection network based on a grounded capacitor according to an embodiment of the present invention.

FIG. 18 is a schematic diagram of the common mode electromagnetic noise injection network based on a grounded capacitor according to an embodiment of the present invention. Referring to FIG. 18, in the common mode electromagnetic noise injection network 25 based on the grounded capacitor, one end of the capacitor $C_4$ is connected to the common mode electromagnetic noise component output end 108 of the previous-stage electromagnetic noise converting network 22, and the other end of the capacitor $C_4$ is grounded or is connected to a shell of the electrical equipment.

The active EMI filter according to an embodiment of the present invention can inject the common mode output component of the previous-stage electromagnetic noise converting network 22 to a common mode noise loop through the fourth capacitor $C_4$ to enable the common mode electromagnetic noise return to the common mode noise source as soon as possible, which can make the EMI receiver detect a small amount of the common mode noise or not detect the common mode noise.

Figure 19:
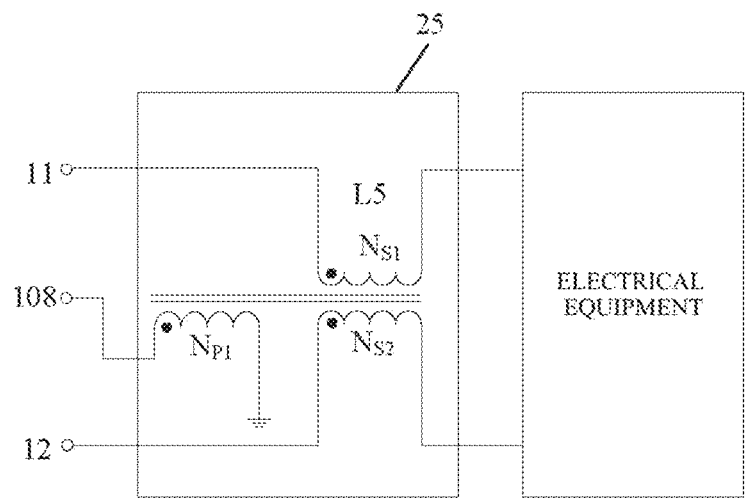
FIG. 19 is a schematic diagram of a common mode electromagnetic noise injection network based on a common mode inductor according to an embodiment of the present invention.

FIG. 19 is a schematic diagram of the common mode electromagnetic noise injection network based on a common mode inductor according to an embodiment of the present invention. Referring to FIG. 19, in the common anode electromagnetic noise injection network 25 based on the common mode inductor, the common mode inductor $L_5$ includes three windings, i.e., the primary winding $N_{P1}$, the first secondary winding $N_{S1}$ and the second secondary winding $N_{S2}$. One end of the primary winding $N_{P1}$ of the common mode inductor $L_5$ is connected to the common mode electromagnetic noise component output end 108 of the previous-stage electromagnetic noise converting network 22, and the other end of the primary winding $N_{P1}$ of the common mode inductor $L_5$ is grounded. One end of the first secondary winding $N_{S1}$ of the common mode inductor $L_5$ is connected to the first input cable 11, and the other end of the first secondary winding $N_{S1}$ of the common mode inductor $L_5$ is connected to the electrical equipment. One end of the second secondary winding $N_{S2}$ of the common mode inductor $L_5$ is connected to the second input cable 12, and the other end of the second secondary winding $N_{S2}$ of the common mode inductor $L_5$ is connected to the electrical equipment.

The active EMI filter according to an embodiment of the present invention can inject the common mode output component of the previous-stage electromagnetic noise converting network 22, via the secondary windings $N_{S1}$ and $N_{S2}$ of the inductor $L_5$, to a common mode noise loop through the primary winding $N_{P1}$ of the inductor $L_5$ to cancel the common mode current in the common mode loop, which can reduce the common mode noise detected by the EMI receiver.

The injection point of the differential mode electromagnetic noise injection network 23 according to an embodiment of the present invention can be any position in the differential mode loop to suppress the differential mode electromagnetic noise. The differential mode loop mentioned in the embodiment of the present invention refers to devices, loops and input cables inside the electrical equipment, through which the differential mode current $I_{DM}$ flows.

Figure 20:
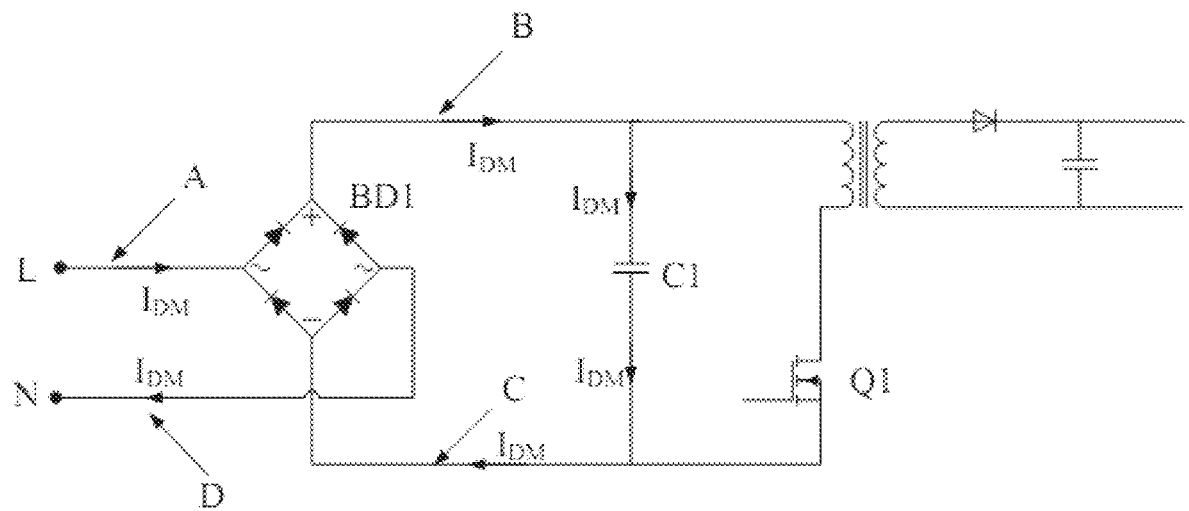
FIG. 20 is a simplified circuit diagram of a power supply adapter with an AC input according to an embodiment of the present invention.

FIG. 20 is a simplified circuit diagram of a power supply adapter with an AC input according to an embodiment of the present invention, Referring to FIG. 20, a loop indicated by black arrows is a differential mode loop through which the differential mode current $I_{DM}$ flows. The differential mode loop is from the Live wire L, the rectifier bridge BD1, the capacitor $C_1$ to the Neutral wire N and also includes connection lines between the devices. The differential mode electromagnetic noise injection point according to an embodiment of the present invention can select four points marked by A, C and D in the circuit shown in FIG. 20 to perform, wherein the point A is the Live wire L, the point B is a connection line between the positive electrode of the rectifier bridge BD1 and the capacitor $C_1$, the point C is a connection line between the negative electrode of the rectifier bridge BD1 and the capacitor and the point D is the Neutral wire N.

When the differential mode electromagnetic noise injection network 23 based on a three-winding differential mode inductor is adopted to perform the differential mode electromagnetic noise injection, two points A and D can be used as the insertion points of the two secondary windings of the three-winding differential mode inductor, alternatively, two points B and C can be used as the insertion points of the two secondary windings of the three-winding differential mode inductor.

Figure 21:
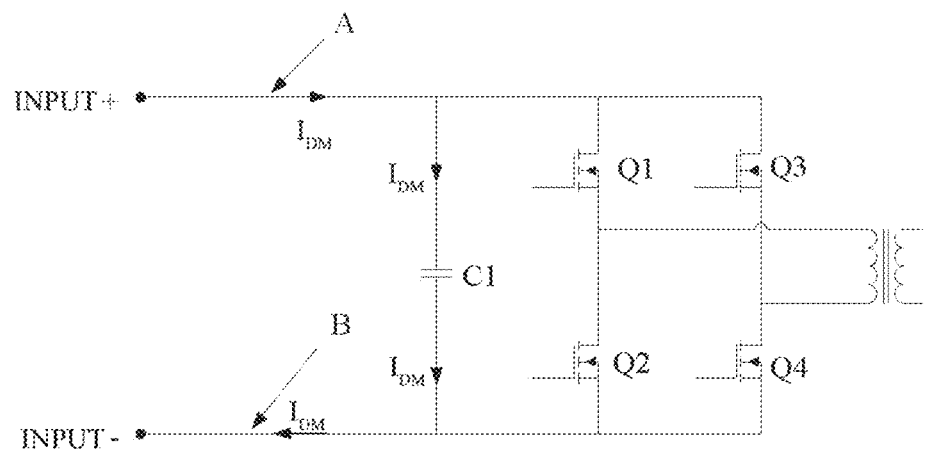
FIG. 21 is a simplified circuit diagram of a switching power supply with a DC input according to an embodiment of the present invention.

FIG. 21 is a simplified circuit diagram of a switching power supply with a DC input according to an embodiment of the present invention. Referring to FIG. 21, a loop indicated by black arrows is a differential mode loop through which the differential mode current $I_{DM}$ flows. The differential mode loop is from a connection line of an input positive electrode, the capacitor $C_1$ to a connection line of an input negative electrode. The differential mode electromagnetic noise injection point according to an embodiment of the present invention can select the points A and B in FIG. 21 to perform injection. The point A is the connection line of the input positive electrode, and the point B is the connection line of the input negative electrode.

When the differential mode electromagnetic noise injection network 23 based on a three-winding differential mode inductor is adopted to perform the differential mode electromagnetic noise injection, two points A and B can be selected as the insertion points of the two secondary windings of the three-winding differential mode inductor.

The injection point of the common mode electromagnetic noise injection network 25 can be any position in the common mode loop to suppress the common mode electromagnetic noise. The common mode loop mentioned in the present invention refers to devices, loops and input cables inside the electrical equipment as well as the ground, through which the common mode current $I_{CM}$ flows.

Figure 22:
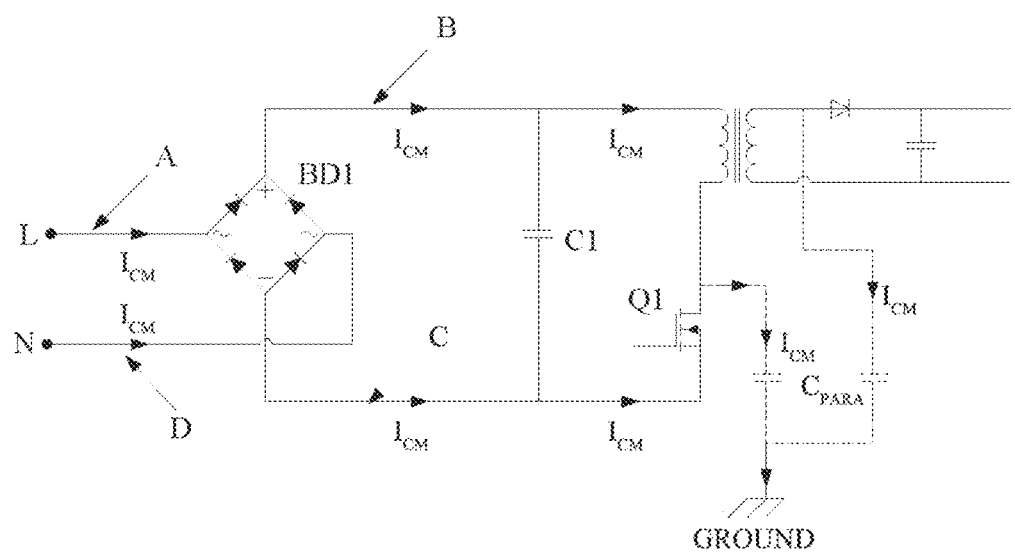
FIG. 22 is a simplified circuit diagram of a power supply adapter with an AC input according to an embodiment of the present invention.

FIG. 22 is a simplified circuit diagram of a power supply adapter with an AC input according to an embodiment of the present invention. Referring to FIG. 22, a loop indicated by black arrows is a common mode loop through which the common mode current $I_{CM}$ flows. The common mode loop is from the Live wire L, the Neutral wire N, the connection line between the positive electrode of the rectifier bridge BD1 and the capacitor $C_1$, the connection line between the negative electrode of the rectifier bridge BD1 and the capacitor $C_1$, the drain of the transistor $Q_1$, and the parasitic capacitor $C_{para}$ between the drain and the ground, then to the ground. The other common mode loop is from a transformer, and the parasitic capacitor $C_{para}$ between the anode of a rectifier diode and the ground, then to the ground.

Different from that the differential mode electromagnetic noise injection network 23 can select a single point to perform injection, the injection points of the common mode electromagnetic noise injection network 25 according to an embodiment of the present invention can select the points A, B, C and D, and the injection points of the common mode electromagnetic noise injection network 25 have to select paired injection points. When the common mode electromagnetic noise injection network 25 based on a capacitor as shown in FIG. 17 is adopted, it has to simultaneously select the points A and B as connection points of the capacitors $C_1$ and $C_2$. Similarly, when the common mode electromagnetic noise injection network 25 based on a three-winding common mode inductor is adopted, the secondary windings of the common mode inductor must be simultaneously inserted at the points A and B.

Figure 23:
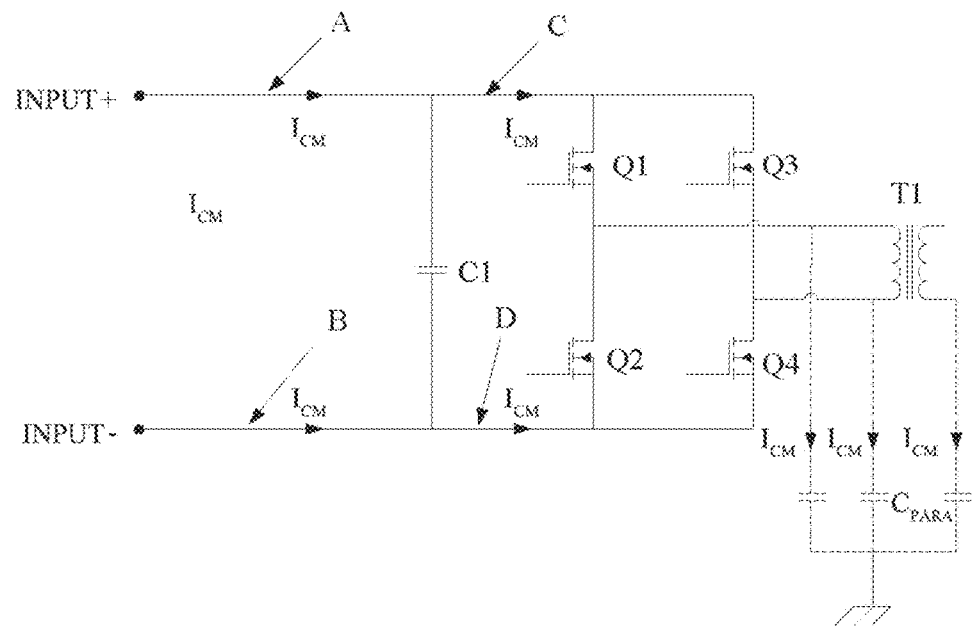
FIG. 23 is a simplified circuit diagram of a switching power supply with a DC input according to an embodiment of the present invention.

FIG. 23 is a simplified circuit diagram of a switching power supply with a DC input according to an embodiment of the present invention. Referring to FIG. 23, a loop indicated by black arrows is a common mode loop through which the common mode current $I_{CM}$ flows. The common mode loop is from a connection line between the input positive electrode and the capacitor $C_1$, a connection line between the input negative electrode and the capacitor $C_1$, a connection line between the capacitor $C_1$ and the drain of the transistor $Q_1$, a connection line between the capacitor $C_1$ and the source of the transistor $Q_2$, a parasitic capacitor $C_{para}$ between a central point of a bridge arm of the transistor $Q_1$ and the transistor $Q_2$ and the ground, a parasitic capacitor $C_{para}$ between a central point of a bridge arm of the transistor $Q_3$ and the transistor $Q_4$ and the ground, a transformer $T_1$, and a parasitic capacitor $C_{para}$ between the transformer $T_1$ and the ground, then to the ground.

Different from that the differential mode electromagnetic noise injection network 23 can select a single point to perform injection, the injection points of the common mode electromagnetic noise injection network 25 according to an embodiment of the present invention can select the points A, B, C and D, and the injection points of the common mode electromagnetic noise injection network 25 have to select paired injection points. When the common mode electromagnetic noise injection network 25 based on the capacitor is adopted, it has to simultaneously select the points A and B as connection points of the capacitors $C_1$ and $C_2$. Similarly, when the common mode electromagnetic noise injection network 25 based on the three-winding common mode inductor is adopted, the secondary windings of the common mode inductor must be simultaneously inserted at the points A and B.

Figure 24:
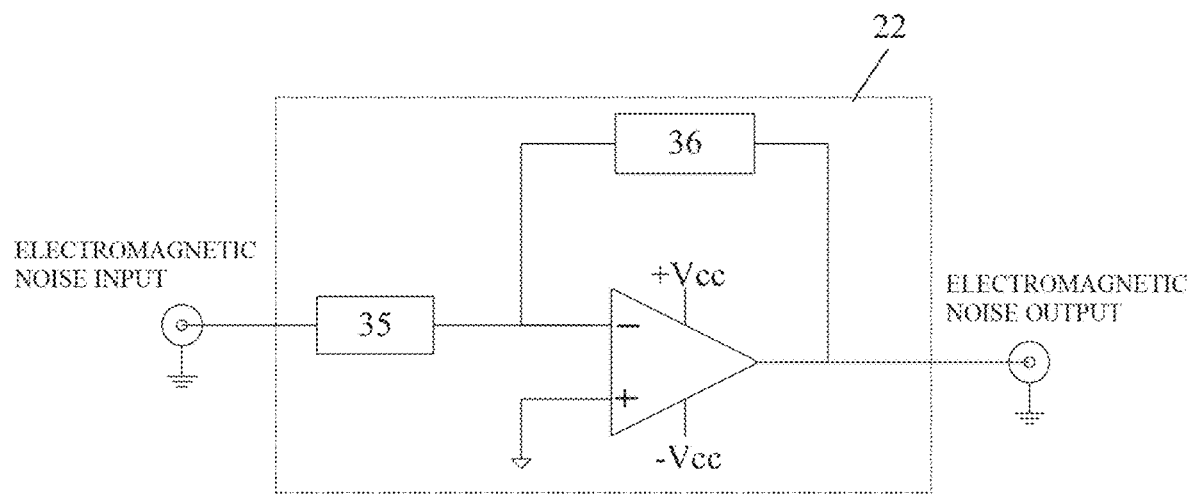
FIG. 24 is a schematic diagram of an electromagnetic noise converting network according to an embodiment of the present invention.

FIG. 24 is a schematic diagram of an electromagnetic noise converting network according to an embodiment of the present invention. Referring to FIG. 8 to FIG. 24, the electromagnetic noise converting network 22 is configured to perform amplification and closed-loop feedback processing on the differential mode electromagnetic noise and the common mode electromagnetic noise output by the previous-stage electromagnetic noise processing network 21, and then output them to the post-stage differential mode electromagnetic noise injection network 23 and common mode electromagnetic noise injection network 25. The electromagnetic noise converting network 22 may employ an operational amplifier, the first resistor-capacitor network 35, and the second resistor-capacitor network 36 to realize gain amplification and closed-loop feedback.

The first end of the first resistor-capacitor network 35 is configured to receive the differential mode electromagnetic noise component output by the differential mode electromagnetic noise extracting network, and the second end of the first resistor-capacitor network 35 is connected to the negative electrode input end of the operational amplifier. The second resistor-capacitor network 36 is connected between the negative electrode input end and the output end of the operational amplifier. By a connection of the output end of the operational amplifier and the differential mode electromagnetic noise component input end of the injection piece of the differential mode electromagnetic noise injection network 23, the differential mode electromagnetic noise component processed by the electromagnetic noise converting network 22 is input to the differential mode electromagnetic noise injection network 23.

The electromagnetic noise converting network 22 performs gain adjustment and phase adjustment by adjusting values of resistors and capacitors in the first resistor-capacitor network 35 and the second resistor-capacitor network 36 to obtain the required gain and phase for suppressing the electromagnetic noise.

The various forms of the electromagnetic noise extracting networks, the differential mode electromagnetic noise injection networks 23, the common mode electromagnetic noise injection networks 25 and the injection points of the processed differential mode electromagnetic noise and common mode electromagnetic noise according to an embodiment of the present invention can be arbitrarily combined as needed practically.

The active EMI filtering technique according to an embodiment of the present invention not only adapts to the AC power supply system, but also adapts to the DC power supply system.

The active EMI filtering technique according to an embodiment of the present invention not only adapts to the Class I electrical equipment with a ground wire input, but also adapts to the Class II electrical equipment without the ground wire input.

Embodiment 1

Figure 25:
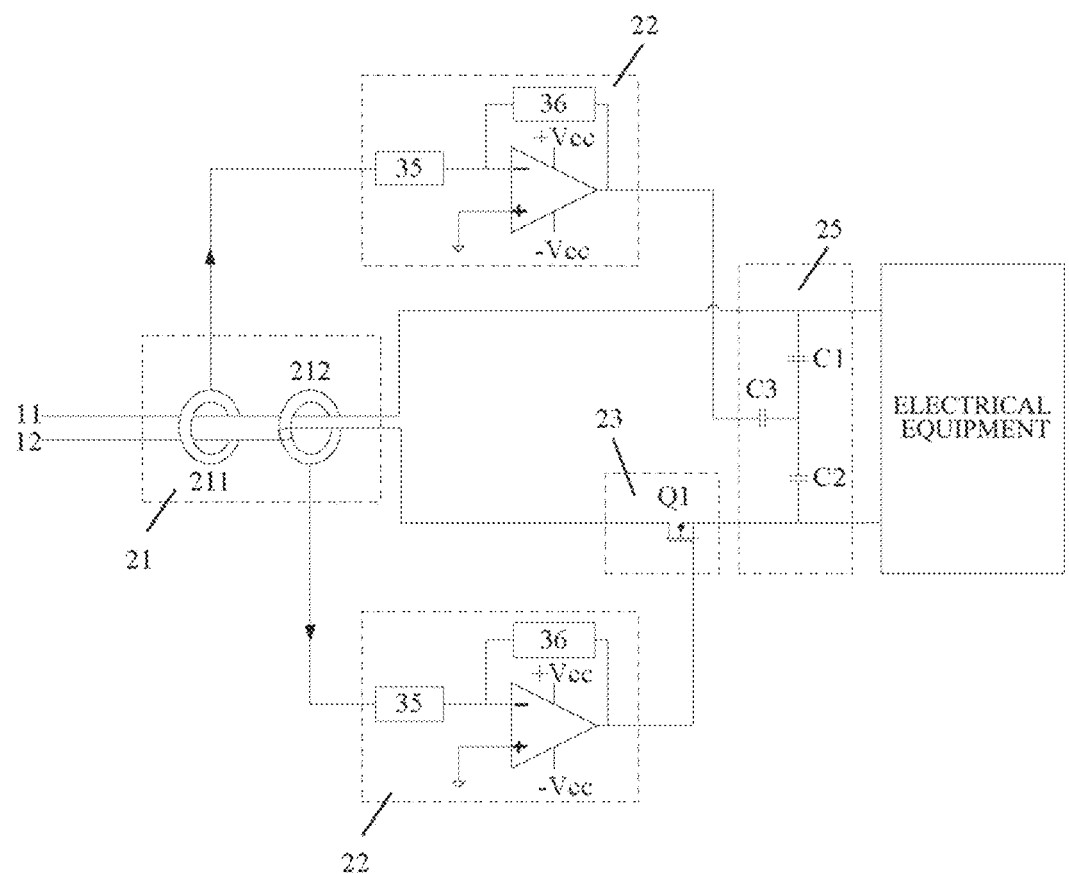
FIG. 25 is a schematic diagram of an active EMI filter according to Embodiment 1 of the present invention.

FIG. 25 is a schematic diagram of an active EMI filter according to Embodiment 1 of the present invention. Referring to FIG. 25. Embodiment 1 of the present invention provides an active electromagnetic interference filter. In Embodiment 1, the electromagnetic noise generated by the electrical equipment is extracted by the electromagnetic noise processing network 21 to separately obtain the differential mode electromagnetic noise and the common mode electromagnetic noise, and after separately performing the gain and closed-loop feedback processing through the two electromagnetic noise converting networks 22, the differential mode noise generated by the post-stage electrical equipment in the differential mode loop is canceled with the processed differential mode electromagnetic noise through the differential mode loop by the differential mode electromagnetic noise injection network 23, and the processed common mode electromagnetic noise is returned to the common mode noise source in the electrical equipment through the common mode loop by the common mode electromagnetic noise injection network 25, thereby realizing the electromagnetic noise inner circulation, satisfying the limit values of the EMI regulations, and enabling the power supply system and the surrounding environment to be not affected by the electromagnetic noise generated by the electrical equipment.

The electromagnetic noise processing network 21 in Embodiment 1 of the present invention is formed by two current transformers, and obtains the differential mode current $I_{DM}$ generated by the differential mode electromagnetic noise and the common mode current $I_{CM}$ generated by the common mode electromagnetic noise.

The differential mode electromagnetic noise injection network 23 in Embodiment 1 of the present invention employs a differential mode electromagnetic noise injection network based on a semiconductor transistor. The common mode electromagnetic noise injection network 25 in Embodiment 1 of the present invention employs a common mode electromagnetic noise injection network based on a capacitor.

Embodiment 2

Figure 26:
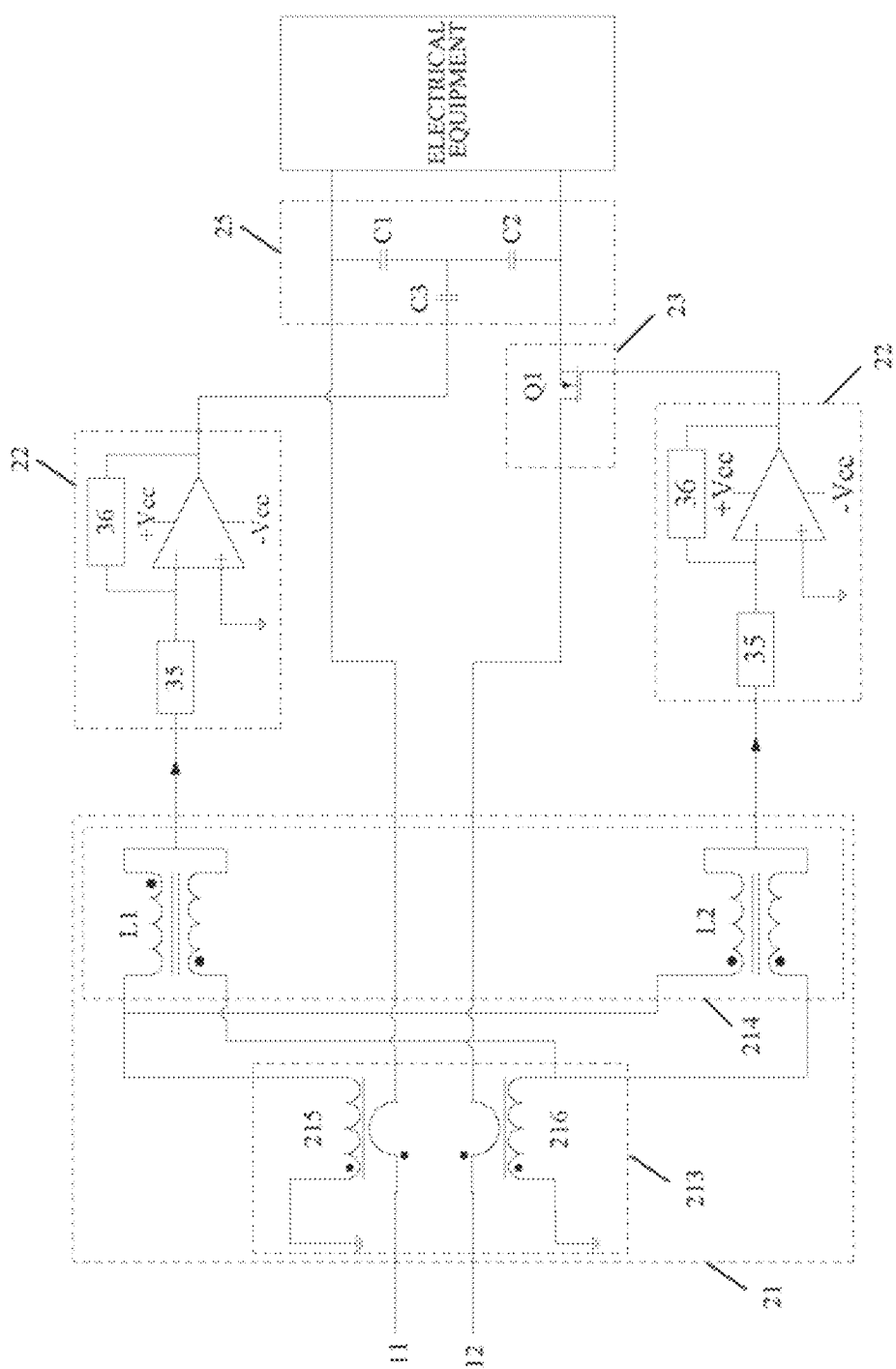
FIG. 26 is a schematic diagram of an active EMI filter according to Embodiment 2 of the present invention.

FIG. 26 is a schematic diagram of an active EMI filter according to Embodiment 2 of the present invention. Referring to FIG. 26, Embodiment 2 of the present invention provides an active electromagnetic interference filter. In Embodiment 2, the electromagnetic noise generated by the electrical equipment is extracted by the electromagnetic noise processing network 21 to separately obtain the differential mode electromagnetic noise and the common mode electromagnetic noise, and after separately performing the gain and closed-loop feedback processing through the two electromagnetic noise converting networks 22, the differential mode noise generated by the post-stage electrical equipment in the differential mode loop is canceled with the processed differential mode electromagnetic noise through the differential mode loop by the differential mode electromagnetic noise injection network 23, and the processed common mode electromagnetic noise is returned to the common mode noise source in the electrical equipment through the common mode loop by the common mode electromagnetic noise injection network 25, thereby realizing the electromagnetic noise inner circulation, satisfying the limit values of the EMI regulations, and enabling the power supply system and the surrounding environment to be not affected by the electromagnetic noise generated by the electrical equipment.

The electromagnetic noise processing network 21 in Embodiment 2 of the present invention is formed by the electromagnetic noise sampling network 213 and the differential-common mode electromagnetic noise extracting network 214. The electromagnetic noise sampling network 213 performs sampling through the current transformers. The differential-common mode electromagnetic noise extracting network 214 employs a magnetic canceling method to extract the differential mode electromagnetic noise and the common mode electromagnetic noise.

The differential mode electromagnetic noise injection network 23 in Embodiment 2 of the present invention employs a differential mode electromagnetic noise injection network based on a semiconductor transistor. The common mode electromagnetic noise injection network 25 in Embodiment 2 of the present invention employs a common mode electromagnetic noise injection network based on a capacitor.

Embodiment 3

Figure 27:
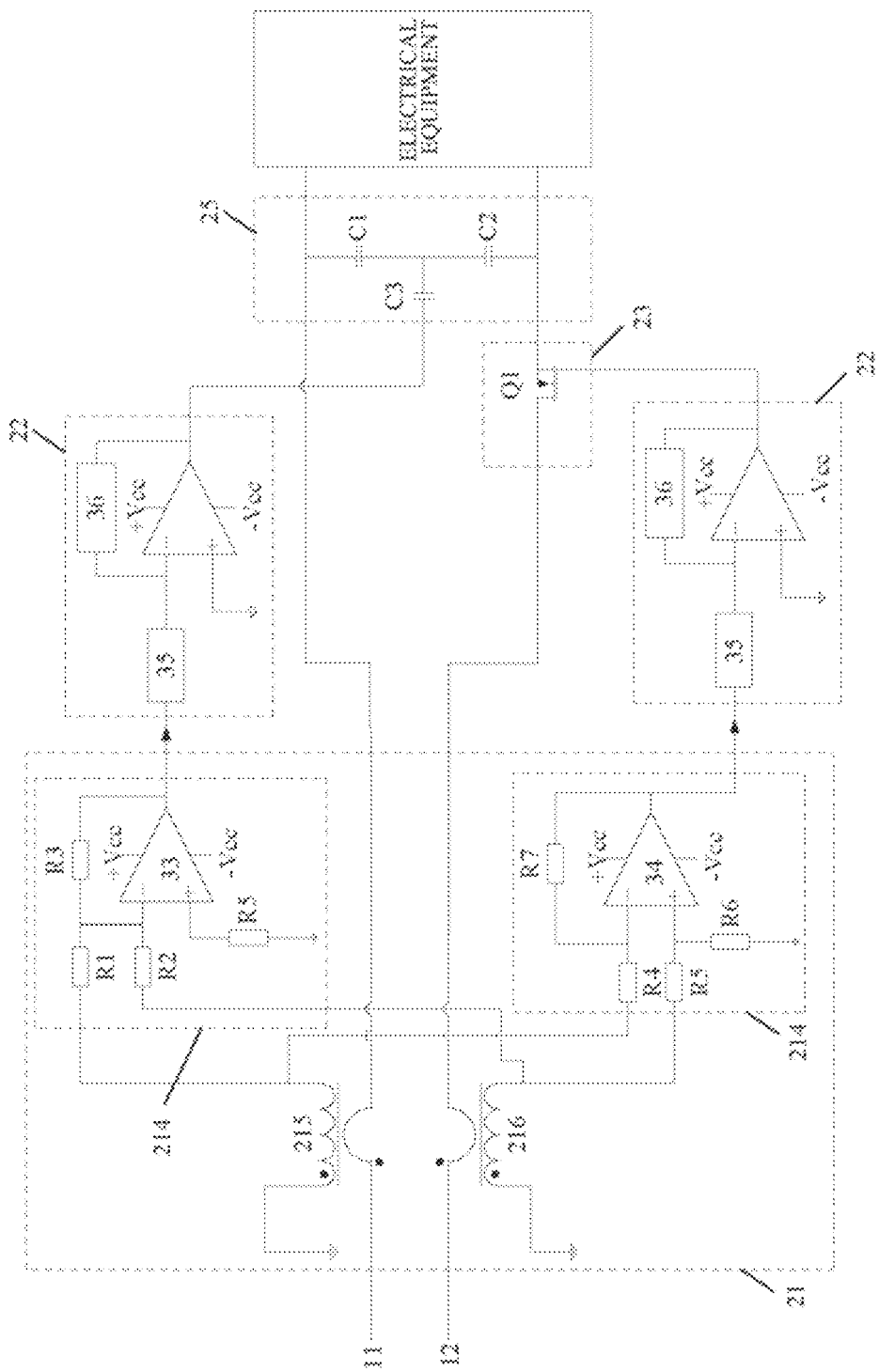
FIG. 27 is a schematic diagram of an active EMI filter according to Embodiment 3 of the present invention.

FIG. 27 is a schematic diagram of an active EMI filter according to Embodiment 3 of the present invention. Referring to FIG. 27, Embodiment 3 of the present invention provides an active electromagnetic interference filter. In Embodiment 3, the electromagnetic noise generated by the electrical equipment is extracted by the electromagnetic noise processing network 21 to separately obtain the differential mode electromagnetic noise and the common mode electromagnetic noise, and after separately performing the gain and closed-loop feedback processing through the two electromagnetic noise converting networks 22, the differential mode noise generated by the post-stage electrical equipment in the differential mode loop is canceled with the processed differential mode electromagnetic noise through the differential mode loop by the differential mode electromagnetic noise injection network 23, and the processed common mode electromagnetic noise is returned to the common mode noise source in the electrical equipment through the common mode loop by the common mode electromagnetic noise injection network 25, thereby realizing the electromagnetic noise inner circulation, satisfying the limit values of the EMI regulations, and enabling the power supply system and the surrounding environment to be not affected by the electromagnetic noise generated by the electrical equipment.

The electromagnetic noise processing network 21 in Embodiment 3 of the present invention is formed by the electromagnetic noise sampling network 213 and the differential-common mode electromagnetic noise extracting network 214. The electromagnetic noise sampling network 213 performs sampling through the current transformers, and the differential-common mode electromagnetic noise extracting network 214 is implemented by a manner of the operational amplifier algebraic sum.

The differential mode electromagnetic noise injection network 23 in Embodiment 3 of the present invention employs a differential mode electromagnetic noise injection network based on a semiconductor transistor. The common mode electromagnetic noise injection network 25 in Embodiment 3 of the present invention employs a common mode electromagnetic noise injection network based on a capacitor.

Embodiment 4

Figure 28:
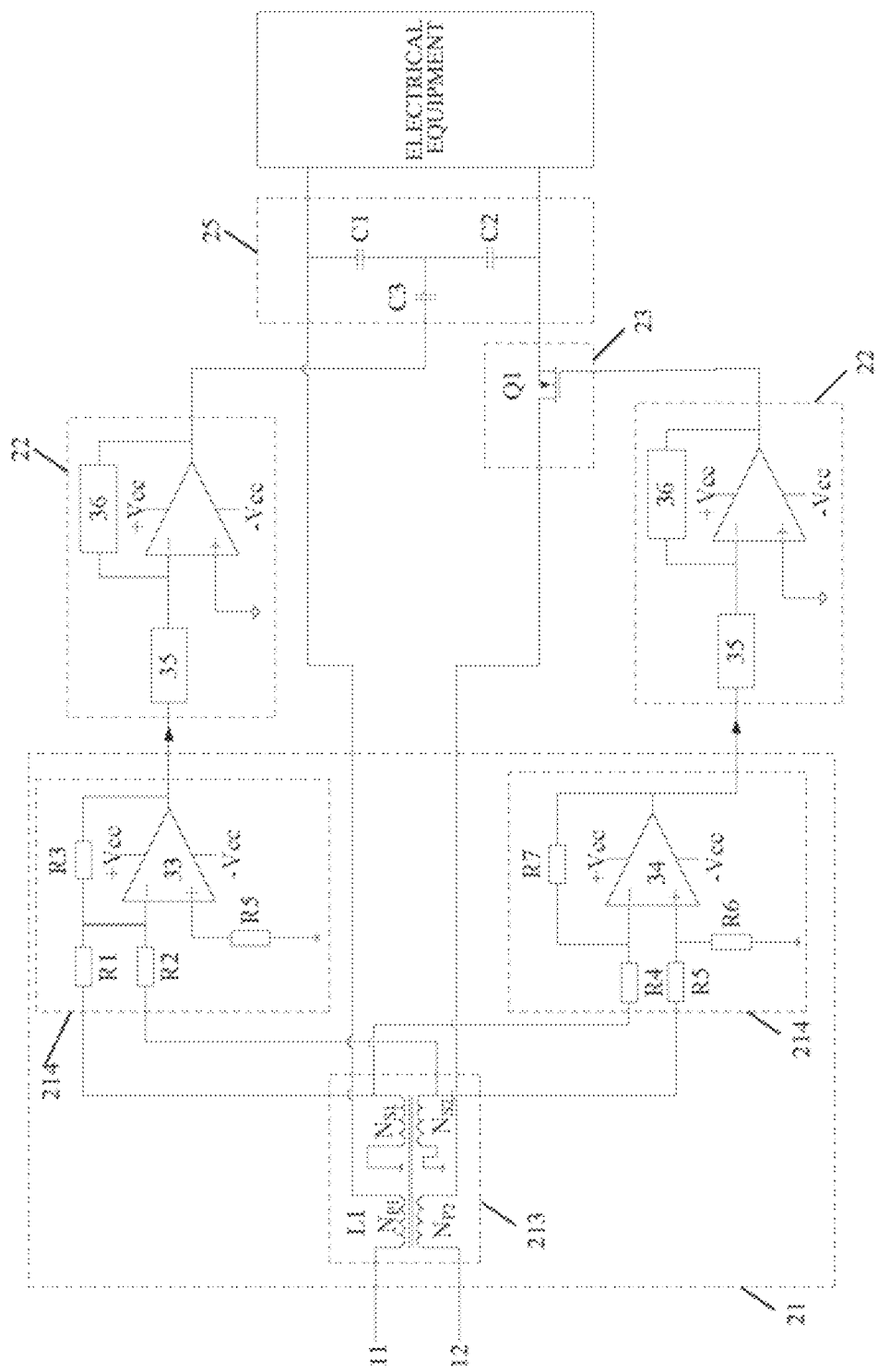
FIG. 28 is a schematic diagram of an active EMI filter according to Embodiment 4 of the present invention.

FIG. 28 is a schematic diagram of an active EMI filter according to Embodiment 4 of the present invention. Referring to FIG. 28, Embodiment 4 of the present invention provides an active electromagnetic interference filter. In Embodiment 4, the electromagnetic noise generated by the electrical equipment is extracted by the electromagnetic noise processing network 21 to separately obtain the differential mode electromagnetic noise and the common mode electromagnetic noise, and after separately performing the gain and closed-loop feedback processing through the two electromagnetic noise converting networks 22, the differential mode noise generated by the post-stage electrical equipment in the differential mode loop is canceled with the processed differential mode electromagnetic noise through the differential mode loop by the differential mode electromagnetic noise injection network 23, and the processed common mode electromagnetic noise is returned to the common mode noise source in the electrical equipment through the common mode loop by the common mode electromagnetic noise injection network 25, thereby realizing the electromagnetic noise inner circulation, satisfying the limit values of the EMI regulations, and enabling the power supply system and the surrounding environment to be not affected by the electromagnetic noise generated by the electrical equipment.

The electromagnetic noise processing network 21 in Embodiment 4 of the present invention is formed by the electromagnetic noise sampling network 213 and the differential-common mode electromagnetic noise extracting network 214. The electromagnetic noise sampling network 213 performs sampling through the differential mode inductors, and the differential-common mode electromagnetic noise extracting network 214 is implemented by a manner of the operational amplifier algebraic sum.

The differential mode electromagnetic noise injection network 23 in Embodiment 4 of the present invention employs a differential mode electromagnetic noise injection network based on a semiconductor transistor. The common mode electromagnetic noise injection network 25 in Embodiment 4 of the present invention employs a common mode electromagnetic noise injection network based on a capacitor.

Embodiment 5

Figure 29:
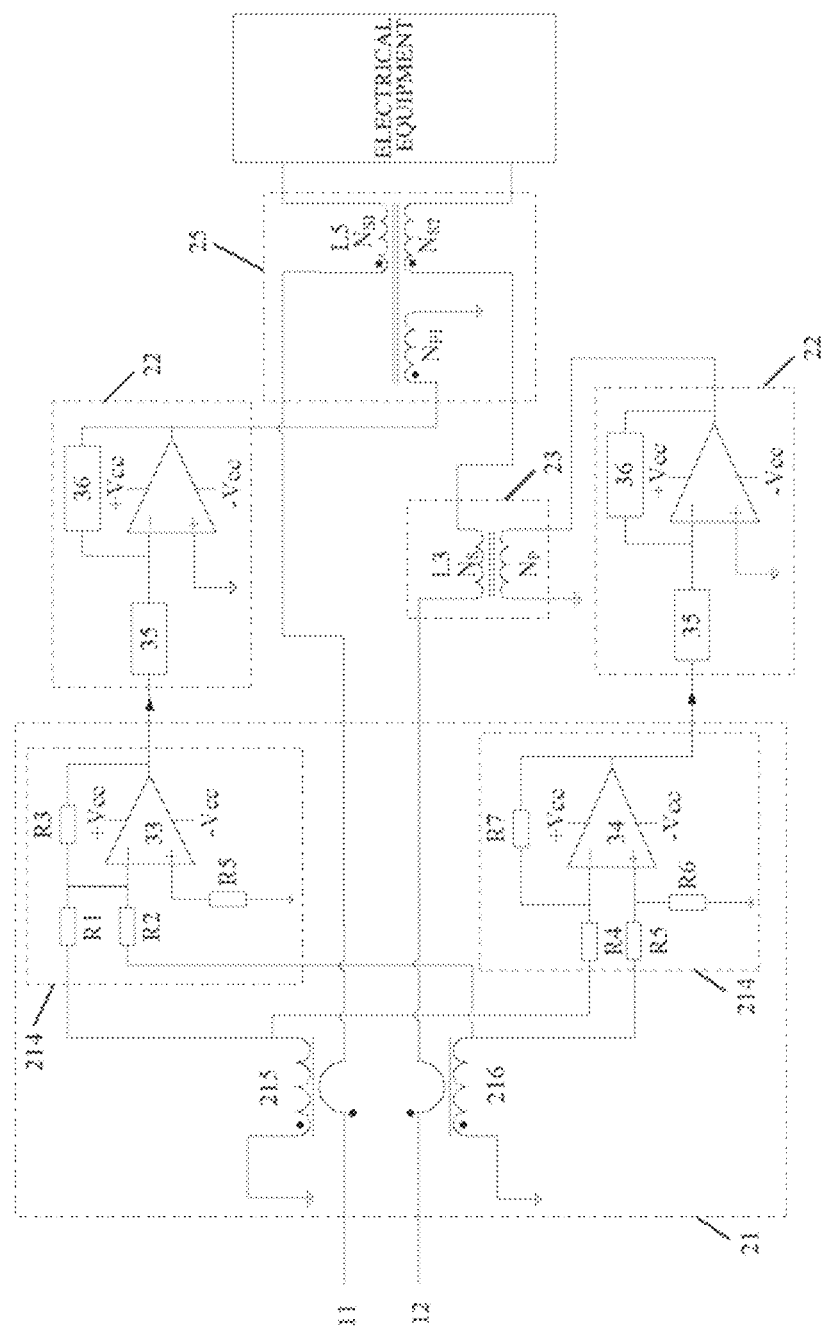
FIG. 29 is a schematic diagram of an active EMI filter according to Embodiment 5 of the present invention.

FIG. 29 is a schematic diagram of an active EMI filter according to Embodiment 5 of the present invention. Referring to FIG. 29, Embodiment 5 of the present invention provides an active electromagnetic interference filter. In Embodiment 5, the electromagnetic noise generated by the electrical equipment is extracted by the electromagnetic noise processing network 21 to separately obtain the differential mode electromagnetic noise and the common mode electromagnetic noise, and after separately performing the gain and closed-loop feedback processing through the two electromagnetic noise converting networks 22, the differential mode noise generated by the post-stage electrical equipment in the differential mode loop is canceled with the processed differential mode electromagnetic noise through the differential mode loop by the differential mode electromagnetic noise injection network 23, and the processed common mode electromagnetic noise is returned to the common mode noise source in the electrical equipment through the common mode loop by the common mode electromagnetic noise injection network 25, thereby realizing the electromagnetic noise inner circulation, satisfying the limit values of the EMI regulations, and enabling the power supply system and the surrounding environment to be not affected by the electromagnetic noise generated by the electrical equipment.

The electromagnetic noise processing network 21 in Embodiment 5 of the present invention is formed by the electromagnetic noise sampling network 213 and the differential-common mode electromagnetic noise extracting network 214. The electromagnetic noise sampling network 213 performs sampling through the current transformers, and the differential-common mode electromagnetic noise extracting network 214 is implemented by a manner of the operational amplifier algebraic sum.

The differential mode electromagnetic noise injection network 23 in Embodiment 5 of the present invention employs a differential mode electromagnetic noise injection network based on a two-winding differential mode inductor. The common mode electromagnetic noise injection network 25 in Embodiment 5 of the present invention employs a common mode electromagnetic noise injection network based on a common mode inductor.

Finally, it should be noted that the above respective embodiments are merely used to illustrate the technical solutions of the present invention, rather than limiting the technical solutions of the present invention. Although the present invention is illustrated in details by referring to the above respective embodiments, those having ordinarily skill in the art should understand: modifications may be performed on the technical solutions recited by the respective embodiments mentioned above, or equivalent replacements may be performed on a part or all of the technical features in the technical solutions; while these modifications or replacements do not make the essence of the corresponding technical solution depart from the scope of the technical solutions of the respective embodiments of the present invention.

What is claimed is:

1. A differential mode electromagnetic noise injection network, comprising an injection piece and a differential mode loop; wherein,
    the injection piece is at least provided with a first injection end, a second injection end and a differential mode electromagnetic noise component input end; wherein,
    the differential mode electromagnetic noise component input end is configured to directly input a differential mode electromagnetic noise component;
    the first injection end and the second injection end are connected to two points connected in series in the differential mode loop in a one-to-one correspondence, and
    the first injection end and the second injection end are configured to directly inject the differential mode electromagnetic noise component;
    the injection piece comprises a semiconductor transistor or a winding differential mode inductor; wherein
    a first electrode of the semiconductor transistor is the first injection end, a second electrode of the semiconductor transistor is the second injection end, and a control pole of the semiconductor transistor is the differential mode electromagnetic noise component input end; and
    the winding differential mode inductor comprises a first winding and a second winding; a first end of the first winding is the differential mode electromagnetic noise component input end, and a second end of the first winding is grounded; a first end of the second winding is the first injection end, and a second end of the second winding is the second injection end.

2. The differential mode electromagnetic noise injection network of claim 1, wherein, the injection piece comprises a two-winding differential mode inductor, and a first winding and a second winding of the two-winding differential mode inductor are a primary winding and a secondary winding, respectively; wherein,
    a first end of the primary winding is the differential mode electromagnetic noise component input end, and a second end of the primary winding is grounded; and
    a first end of the secondary winding is the first injection end, and a second end of the secondary winding is the second injection end.

3. The differential mode electromagnetic noise injection network of claim 1, wherein, the injection piece comprises a three-winding differential mode inductor, and three windings of the three-winding differential mode inductor are a first winding and two second windings, respectively; wherein,
    the first winding is a primary winding, and the two second windings are a first secondary winding and a second secondary winding, respectively; the first secondary winding and the second secondary winding are opposite to each other and have opposite polarities;
    a first end of the primary winding is the differential mode electromagnetic noise component input end, and a second end of the primary winding is grounded; and
    each of a first end of the first secondary winding and a first end of the second secondary winding is the first injection end, and each of a second end of the first secondary winding and a second end of the second secondary winding is the second injection end.

4. The differential mode electromagnetic noise injection network of claim 1, wherein, the differential mode loop comprises a Live wire, a Neutral wire, a rectifier bridge and a capacitor; wherein,
    the Live wire and the Neutral wire are connected to the rectifier bridge, and the capacitor is connected between a positive electrode of the rectifier bridge and a negative electrode of the rectifier bridge;
a first injection point corresponding to the first injection end of the injection piece is located on the Live wire, the Neutral wire, a first connection line between the capacitor and the positive electrode of the rectifier bridge, or a second connection line between the capacitor and the negative electrode of the rectifier bridge; and
a second injection point corresponding to the second injection end of the injection piece is located on the Live wire, the Neutral wire, the first connection line between the capacitor and the positive electrode of the rectifier bridge, or the second connection line between the capacitor and the negative electrode of the rectifier bridge.

5. The differential mode electromagnetic noise injection network of claim 1, wherein, the differential mode loop comprises a Live wire, a Neutral wire, a rectifier bridge and a capacitor; wherein,
the Live wire and the Neutral wire are connected to the rectifier bridge, and the capacitor is connected between a positive electrode of the rectifier bridge and a negative electrode of the rectifier bridge;
two injection points corresponding to the first injection end and the second injection end are located on the Live wire and the Neutral wire, respectively; and
alternatively, the two injection points corresponding to the first injection end and the second injection end are separately located on a first connection line between the capacitor and the positive electrode of the rectifier bridge and a second connection line between the capacitor and the negative electrode of the rectifier bridge.

6. The differential mode electromagnetic noise injection network of claim 1, wherein, the differential mode loop comprises an input positive electrode connection line, an input negative electrode connection line and a capacitor, and a current direction of the differential mode loop is from the input positive electrode connection line to the input negative electrode connection line via the capacitor;
a first injection point corresponding to the first injection end is located on the input positive electrode connection line or the input negative electrode connection line; and
a second injection point corresponding to the second injection end is located on the input positive electrode connection line or the input negative electrode connection line.

7. An active electromagnetic interference filter, comprising a differential mode electromagnetic noise injection network,
wherein the differential mode electromagnetic noise injection network comprises an injection piece and a differential mode loop;
wherein, the injection piece is at least provided with a first injection end, a second injection end and a differential mode electromagnetic noise component input end;
wherein, the differential mode electromagnetic noise component input end is configured to directly input a differential mode electromagnetic noise component;
the first injection end and the second injection end are connected to two points connected in series in the differential mode loop in a one-to-one correspondence, and
the first injection end and the second injection end are configured to directly inject the differential mode electromagnetic noise component;
the injection piece comprises a semiconductor transistor or a winding differential mode inductor;
wherein a first electrode of the semiconductor transistor is the first injection end, a second electrode of the semiconductor transistor is the second injection end, and a control pole of the semiconductor transistor is the differential mode electromagnetic noise component input end; and
the winding differential mode inductor comprises a first winding and a second winding; a first end of the first winding is the differential mode electromagnetic noise component input end, and a second end of the first winding is grounded; a first end of the second winding is the first injection end, and a second end of the second winding is the second injection end.

8. The active electromagnetic interference filter of claim 7, further comprising an electromagnetic noise converting network; wherein,
the electromagnetic noise converting network comprises a first resistor-capacitor network, a second resistor-capacitor network and an operational amplifier;
a first end of the first resistor-capacitor network is configured to receive the differential mode electromagnetic noise component, and a second end of the first resistor-capacitor network is connected to a negative electrode input end of the operational amplifier;
the second resistor-capacitor network is connected between the negative electrode input end and an output end of the operational amplifier; and
by a connection of the output end of the operational amplifier and the differential mode electromagnetic noise component input end of the injection piece of the differential mode electromagnetic noise injection network, the differential mode electromagnetic noise component processed by the electromagnetic noise converting network is input to the differential mode electromagnetic noise injection network.

9. The active electromagnetic interference filter of claim 8, further comprising a differential mode electromagnetic noise extracting network; wherein, the differential mode electromagnetic noise extracting network is connected to the electromagnetic noise converting network, and the differential mode electromagnetic noise extracting network is configured to extract the differential mode electromagnetic noise component in an input cable and output the differential mode electromagnetic noise component to the electromagnetic noise converting network.

10. The active electromagnetic interference filter of claim 7, wherein, the injection piece comprises a two-winding differential mode inductor, and a first winding and a second winding of the two-winding differential mode inductor are a primary winding and a secondary winding, respectively; wherein,
a first end of the primary winding is the differential mode electromagnetic noise component input end, and a second end of the primary winding is grounded; and
a first end of the secondary winding is the first injection end, and a second end of the secondary winding is the second injection end.

11. The active electromagnetic interference filter of claim 7, wherein, the injection piece comprises a three-winding differential mode inductor, and three windings of the three-winding differential mode inductor are a first winding and two second windings, respectively; wherein, the first winding is a primary winding; and the two second windings are a first secondary winding and a second secondary winding, respectively; the first secondary winding and the second secondary winding are opposite to each other and have opposite polarities;

a first end of the primary winding is the differential mode electromagnetic noise component input end, and a second end of the primary winding is grounded; and each of a first end of the first secondary winding and a first end of the second secondary winding is the first injection end, and each of a second end of the first secondary winding and a second end of the second secondary winding is the second injection end.

12. The active electromagnetic interference filter of claim 7, wherein, the differential mode loop comprises a Live wire, a Neutral wire, a rectifier bridge and a capacitor; wherein, the Live wire and the Neutral wire are connected to the rectifier bridge, and the capacitor is connected between a positive electrode of the rectifier bridge and a negative electrode of the rectifier bridge;

a first injection point corresponding to the first injection end of the injection piece is located on the Live wire, the Neutral wire, a first connection line between the capacitor and the positive electrode of the rectifier bridge, or a second connection line between the capacitor and the negative electrode of the rectifier bridge; and a second injection point corresponding to the second injection end of the injection piece is located on the Live wire, the Neutral wire, the first connection line between the capacitor and the positive electrode of the rectifier bridge, or the second connection line between the capacitor and the negative electrode of the rectifier bridge.

13. The active electromagnetic interference filter of claim 7, wherein, the differential mode loop comprises a Live wire, a Neutral wire, a rectifier bridge and a capacitor; wherein, the Live wire and the Neutral wire are connected to the rectifier bridge, and the capacitor is connected between a positive electrode of the rectifier bridge and a negative electrode of the rectifier bridge;

two injection points corresponding to the first injection end and the second injection end are located on the Live wire and the Neutral wire, respectively; and alternatively, the two injection points corresponding to the first injection end and the second injection end are separately located on a first connection line between the capacitor and the positive electrode of the rectifier bridge and a second connection line between the capacitor and the negative electrode of the rectifier bridge.

14. The active electromagnetic interference filter of claim 7, wherein, the differential mode loop comprises an input positive electrode connection line, an input negative electrode connection line and a capacitor, and a current direction of the differential mode loop is from the input positive electrode connection line to the input negative electrode connection line via the capacitor;

a first injection point corresponding to the first injection end is located on the input positive electrode connection line or the input negative electrode connection line; and a second injection point corresponding to the second injection end is located on the input positive electrode connection line or the input negative electrode connection line.

* * * * *